(12) United States Patent
Hwu et al.

(10) Patent No.: US 11,605,674 B2
(45) Date of Patent: Mar. 14, 2023

(54) METAL-INSULATOR-SEMICONDUCTOR-INSULATOR-METAL (MISIM) DEVICE, METHOD OF OPERATION, AND MEMORY DEVICE INCLUDING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei (TW); Hao-Hsiung Lin, Taipei (TW); Chang-Feng Yan, Taoyuan (TW); Samuel C. Pan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/334,687

(22) Filed: May 29, 2021

(65) Prior Publication Data
US 2021/0288110 A1 Sep. 16, 2021

Related U.S. Application Data

(63) Continuation of application No. 16/725,516, filed on Dec. 23, 2019, now Pat. No. 11,024,674, which is a
(Continued)

(51) Int. Cl.
*H01L 27/00* (2006.01)
*H01L 27/26* (2006.01)
(Continued)

(52) U.S. Cl.
CPC ............ *H01L 27/265* (2013.01); *G11C 11/34* (2013.01); *G11C 11/56* (2013.01);
(Continued)

(58) Field of Classification Search
CPC ....... H01L 33/405; H01L 33/44; H01L 33/62; H01L 33/38; H01L 2933/0025;
(Continued)

(56) References Cited

U.S. PATENT DOCUMENTS 10,186,640 B2 * 1/2019 Lee .................. H01L 33/385
2009/0176327 A1 7/2009 Oohashi et al.
(Continued)

OTHER PUBLICATIONS

Y. K. Lin and J. G. Hwu, "Role of Lateral Diffusion Current in Perimeter-Dependent Current of MOS(p) Tunneling Temperature Sensors," in IEEE Transactions on Electron Devices, vol. 61, No. 10, pp. 3562-3565, Oct. 2014.
(Continued)

*Primary Examiner* — Thong Q Le
(74) *Attorney, Agent, or Firm* — McDermott Will & Emery LLP

(57) ABSTRACT

A metal-insulator-semiconductor-insulator-metal (MISIM) device includes a semiconductor layer, an insulating layer disposed over an upper surface of the semiconductor layer, a back electrode disposed over a lower surface of the semiconductor layer opposing the upper surface, and first and second electrodes disposed over the insulating layer and spaced-apart from each other.

20 Claims, 38 Drawing Sheets

Related U.S. Application Data continuation of application No. 16/007,678, filed on Jun. 13, 2018, now Pat. No. 10,515,998.

(60) Provisional application No. 62/565,410, filed on Sep. 29, 2017.

(51) Int. Cl.

| | |
|---|---|
| *G11C 11/34* | (2006.01) |
| *H01L 47/02* | (2006.01) |
| *G11C 11/56* | (2006.01) |
| *H01L 29/417* | (2006.01) |
| *G11C 13/00* | (2006.01) |
| *H01L 29/88* | (2006.01) |
| *H01L 27/105* | (2023.01) |

(52) U.S. Cl.
CPC ...... *G11C 13/0007* (2013.01); *H01L 27/1052* (2013.01); *H01L 29/417* (2013.01); *H01L 29/88* (2013.01); *H01L 47/02* (2013.01)

(58) Field of Classification Search
CPC . H01L 33/32; H01L 33/42; H01L 2933/0016; H01L 27/156; H01L 33/20; H01L 2933/0066; H01L 33/24; H01L 2224/48091; H01L 33/0093; H01L 33/382; H01L 33/0095; H01L 25/0753; H01L 33/387; H01L 2924/00014; H01L 33/385; H01L 33/50; H01L 2224/73265; H01L 33/005; H01L 33/52; H01L 33/56; H01L 29/7869; H01L 2933/0041; H01L 33/0075; H01L 33/46; H01L 33/507; H01L 25/0655; H01L 27/1225; H01L 2933/005; H01L 33/0012; H01L 33/145; H01L 29/2003; H01L 2924/00; H01L 2924/0002; H01L 33/007; H01L 33/06; H01L 33/08; H01L 33/60; H01L 2224/49107; H01L 25/167; H01L 27/124; H01L 29/0847; H01L 33/12; H01L 33/22; H01L 33/36; H01L 21/0254; H01L 21/28; H01L 27/1052; H01L 27/265; H01L 29/417; H01L 29/45; H01L 29/861; H01L 29/88; H01L 2924/01322
See application file for complete search history.

(56) References Cited

U.S. PATENT DOCUMENTS

| | | |
|---|---|---|
| 2015/0263061 A1 | 9/2015 | Karim |
| 2017/0323885 A1 | 11/2017 | Pitts |

OTHER PUBLICATIONS

L. Esaki and R. Tsu, "Superlattices and negative differential conductivity in semiconductors," IBM J. Res. Develop., vol. 14, pp. 61-65, 1970.

Wei-Lian Guo et al., "CMOS-NDR transistor," 2008 9th International Conference on Solid-State and Integrated-Circuit Technology, Beijing, 2008, pp. 92-95.

S. Mookerjea et al., "Experimental demonstration of 100nm channel length In0.53Ga0.47As-based vertical inter-band tunnel field effect transistors (TFETs) for ultra low-power logic and SRAM applications," 2009 IEEE International Electron Devices Meeting (IEDM), Baltimore, MD, 2009, pp. 1-3.

Wen-Chau Liu et al., "A novel InP/InAlGaAs negative-differential-resistance heterojunction bipolar transistor (NDR-HBT) with interesting topee-shaped current-voltage characteristics," in IEEE Electron Device Letters, vol. 20, No. 10, pp. 510-513, Oct. 1999.

Chang-Feng Yang and Jenn-Gwo Hwu, "Turnable Negative Differential Resistance in MISIM Tunnel Diodes Structure With Concentric Electrodes Controlled by Designed Substrate Bias", IEEE Transactions on Electron Devices, vol. 64, No. 12, Dec. 2017, pp. 5230-5235.

Chang-Feng Yang and Jenn-Gwo Hwu, "Double Negative Differential Resistance Properties in NISIM Structure with Substrate Grounded and Two Electrode Terminals Biased with Constant Offset Voltage", ECS Transactions, vol. 80, No. 1, (2017)), pp. 81-89.

Non-final Office Action issued in related U.S. Appl. No. 16/007,678, dated Apr. 2, 2019.

Notice of Allowance issued in related U.S. Appl. No. 16/007,678, dated Aug. 2, 2019.

Non-Final Office Action issued in U.S. Appl. No. 16/725,516, dated Sep. 21, 2020.

Notice of Allowance issued in U.S. Appl. No. 16/725,516, dated Feb. 1, 2021.

* cited by examiner

| | WL | BL |
|---|---|---|
| Write 0 | $V_{pass}$ | $V_0$ |
| Write 1 | $V_{pass}$ | $V_1$ |
| Read | $V_{pass}$ | Read $V_0$ / $V_1$ |

| | Bit 1 | Bit 2 |
|---|---|---|
| | $V_{in1}$ (=$V_{out2}$) | $V_{IN2}$ (=$V_{out1}$) |
| 0 0 | 0~1.2V (Ex. 0.39V) | 0~1.2V (Ex. 0.39V) |
| 0 1 | 0~1.2V (Ex. 0.71V) | 1.2~2V (Ex. 1.69V) |
| 1 0 | 1.2~2V (Ex. 1.69V) | 0~1.2V (Ex. 0.71V) |
| 1 1 | 1.2~2V (Ex. 1.80V) | 1.2~2V (Ex. 1.80V) |

…

METAL-INSULATOR-SEMICONDUCTOR-INSULATOR-METAL (MISIM) DEVICE, METHOD OF OPERATION, AND MEMORY DEVICE INCLUDING THE SAME

PRIORITY CLAIM AND CROSS-REFERENCE

This application is a Continuation Application of U.S. application Ser. No. 16/725,516, filed on Dec. 23, 2019, now U.S. Pat. No. 11,024,674, which is a Continuation Application of U.S. application Ser. No. 16/007,678, filed on Jun. 13, 2018, now U.S. Pat. No. 10,515,998, which claims priority to U.S. Provisional Application No. 62/565,410 filed on Sep. 29, 2017, entitled "METAL-INSULATOR-SEMICONDUCTOR-INSULATOR-METAL (MISIM) STRUCTURE, METHOD OF OPERATION, AND MEMORY DEVICE INCLUDING THE SAME," the entire disclosure of each of which are incorporated herein by reference.

BACKGROUND

A negative differential resistance (NDR) device has a two-terminal configuration or a three-terminal configuration. As to the two-terminal configuration, it is difficult to tune the NDR device to allow the NDR device to operate in an extended working range. On the other hand, as to the three-terminal configuration, contemporary NDR devices are CMOS incompatible or can operate only in a single NDR mode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
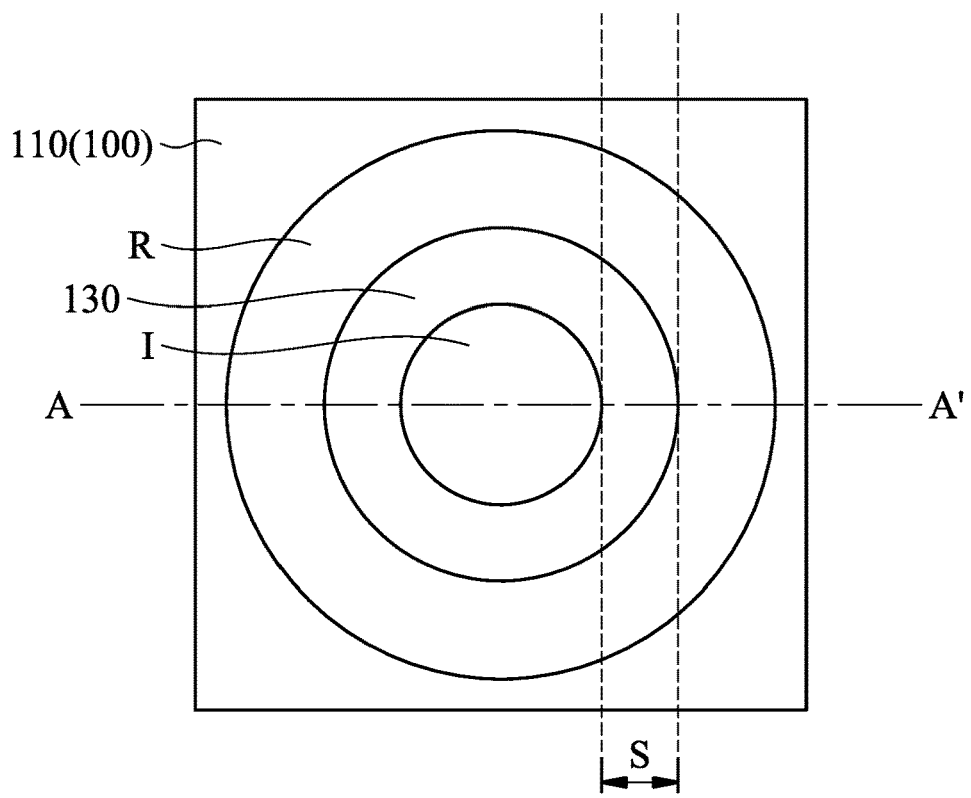
FIG. 1 shows a plan view of a metal-insulator-semiconductor-insulator-metal (MISIM) according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the entire disclosure, "about n m," in which "n" is a number and "m" is a unit, used to describe a parameter means that the parameter is "exactly n m" or the parameter is offset from "exactly n m" when design error/margin, manufacturing error/margin, measurement error etc. are considered. Such a description is recognizable to one of ordinary skill in the art.

Figure 2:
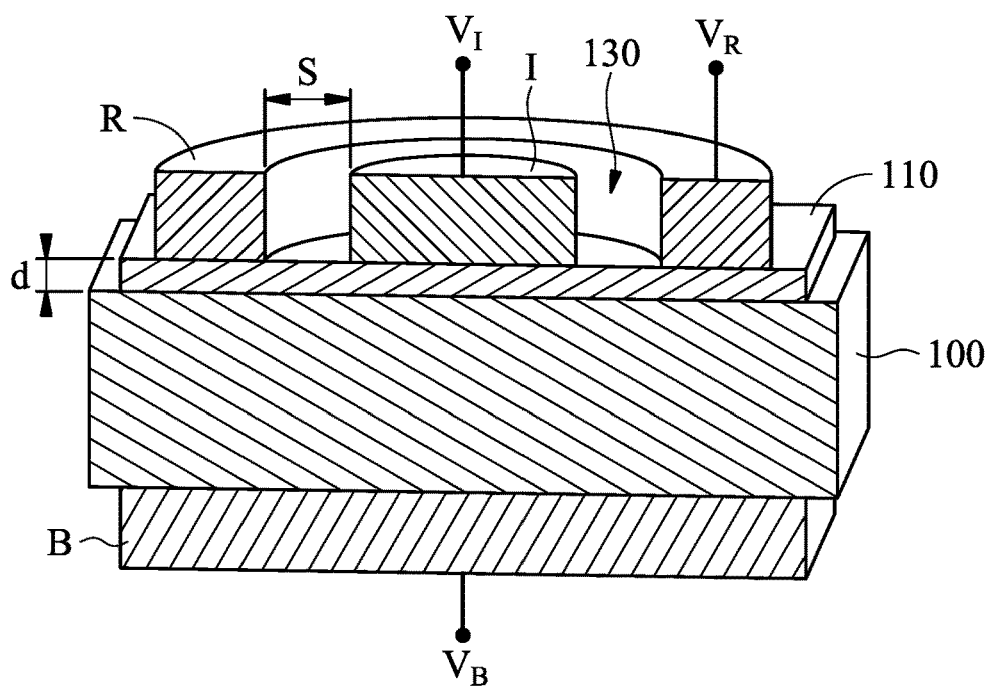
FIG. 2 shows a three-dimensional, cross-sectional view of the MISIM taken along line A-A' shown in FIG. 1.

FIG. 1 shows a plan view of a metal-insulator-semiconductor-insulator-metal (MISIM) according to embodiments of the present disclosure. FIG. 2 shows a three-dimensional, cross-sectional view of the MISIM taken along line A-A' shown in FIG. 1.

Referring to the drawings, the MISIM according to embodiments of the present disclosure includes a semiconductor layer 100, an insulating layer 110 disposed on an upper surface of the semiconductor layer 100, a first electrode I disposed on the insulating layer 110, a second electrode R disposed on the insulating layer 110 and spaced-apart from the first electrode I, and a back electrode B disposed on a lower surface of the semiconductor layer 100 opposing the upper surface of the semiconductor layer 100.

According to some embodiments, the semiconductor layer 100 includes, or consist essentially of, a group II, a group III, a group IV, a group V, and/or a group VI element, and/or combinations thereof, for example, selected from the group consisting of silicon, germanium, silicon germanium, gallium arsenide, aluminum antimonide, indium aluminum antimonide, indium antimonide, indium arsenide, indium phosphide, gallium nitride, and combinations thereof. The present disclosure, however, is not limited thereto, and any suitable semiconductor material can be used to make the semiconductor layer 100.

In some embodiments, the semiconductor layer 100 is made of a semiconductor substrate, and the first electrode I and the second electrode R, and the back electrode B are disposed on opposite sides of the semiconductor substrate, as shown in FIG. 1.

In other embodiments, the semiconductor layer 100 is a semiconductor layer disposed on a substrate which is made one of the above-described semiconductor materials or is an insulating substrate. In this case, the back electrode B is embedded between the semiconductor layer 100 and the substrate. These features will be shown in greater detail with reference to FIG. 21 to be described later.

Referring to FIG. 1, according to some embodiments, the semiconductor layer 100 is made of an N-type semiconductor material with N-type dopants with a doping concentration of about $5 \cdot 10^{14}/cm^{-3}$ to about $5 \cdot 10^{17}/cm^{-3}$, or is made of a P-type semiconductor material with a doping concentration of about $5 \cdot 10^{14}/cm^{-3}$ to about $5 \cdot 10^{17}/cm^{-3}$. The doping concentration is not limited thereto and can be adjusted to be less than $5 \cdot 10^{14}/cm^{-3}$ or greater than $5 \cdot 10^{17}/cm^{-3}$, according to design particulars.

According to some embodiments, the first electrode I has a circular shape, and the second electrode R has a ring shape surrounding the first electrode I and is spaced-apart from the first electrode I by a distance S, as shown in FIG. 1. In some embodiment, the first electrode I has a diameter of about 100 nm to about 400 μm, the distance S between the first electrode I and the second electrode R is about 5 nm to about 30 μm, and an inner diameter of the ring-shape second electrode R is about 110 nm to about 460 μm. In some embodiments, the first electrode I has the diameter of about 200 nm to about 20 μm, the distance S between the first electrode I and the second electrode R is about 20 nm to about 1 μm, and the inner diameter of the ring-shaped second electrode R is about 400 nm to about 50 μm. The dimensions of the diameter of the first electrode I, the distance S, and the inner diameter of the ring-shaped second electrode R should not be limited thereto and can be modified according to design particulars.

In some embodiments, the first electrode I and the second electrode R can be formed by patterning a metal layer formed on the insulating layer 110. In this case, the first electrode I and the second electrode R are formed of the same conductive material. The present disclosure, however, is not limited thereto, and the materials for forming the first electrode I and the second electrode R can be different from each other, according to design particulars.

In a case in which the semiconductor layer 100 is an N-type semiconductor layer, the first electrode I and the second electrode R have a flatband voltage $V_{FB}>0$, and can be made of one of gold, silver, platinum, nickel, or an alloy thereof. In a case in which the semiconductor layer 100 is a P-type semiconductor layer, the first electrode I and the second electrode R have a flatband voltage $V_{FB}<0$, and can be made of one of aluminum, hafnium, magnesium, or an alloy thereof. As to the material to make the first electrode I and the second electrode R, any other conductive material such as metal or metal alloy can be used, as long as the flatband voltage $V_{FB}$ of the first electrode I and the second electrode R is greater than 0 when the semiconductor layer 100 is an N-type semiconductor layer or the flatband voltage $V_{FB}$ of the first electrode I and the second electrode R is less than 0 when the semiconductor layer 100 is a P-type semiconductor layer.

The back electrode B can be made of any suitable conductive material including, but not limited to, aluminum, gold, titanium, polysilicon, silver, nickel, copper, or a mixture thereof.

In some embodiments, the insulating layer 110 is made of any insulating material, for example, an oxide layer or a nitride layer. In some embodiments, the insulating layer is made of an oxide layer or a nitride layer of the material used to form the semiconductor layer 100. When the semiconductor layer 100 is made of silicon, the insulating layer 100 is made of silicon oxide, silicon nitride, or silicon oxynitride. The material for making the insulating layer 110, however, is not limited thereto. In some embodiments, the insulating layer 110 is made of a high-k dielectric material, such as $HfO_2$, HfSiO, HfSiON, HfTaO, HfTiO, HfZrO, $ZrO_2$, $Al_2O_3$, $TiO_2$, hafnium dioxide-alumina ($HfO_2$—$Al_2O_3$) alloy, or a combination thereof.

In some embodiments, a thickness d of the insulating layer 110 is about 1 nm to about 4 nm, such that tunneling between the first electrode I and the second electrode R occurs. However, the thickness d of the insulating layer 110 can be less than about 1 nm or more than about 4 nm, depending on dimensions of the MISIM, such as the diameter of the first electrode I, the distance S, and the inner diameter of the second electrode R, the materials used to form the semiconductor layer 100, the insulating layer 110, the first electrode I, and the second electrode R, the doping concentration of the semiconductor layer 100, and/or operating voltages applied to terminals such as the first electrode I, the second electrode R, and the back electrode B.

Although not shown, in some embodiments, the MISIM further includes another insulating layer disposed between the first electrode I and the second electrode R so as to fill the space between the first electrode I and the second electrode R.

Figure 3A:
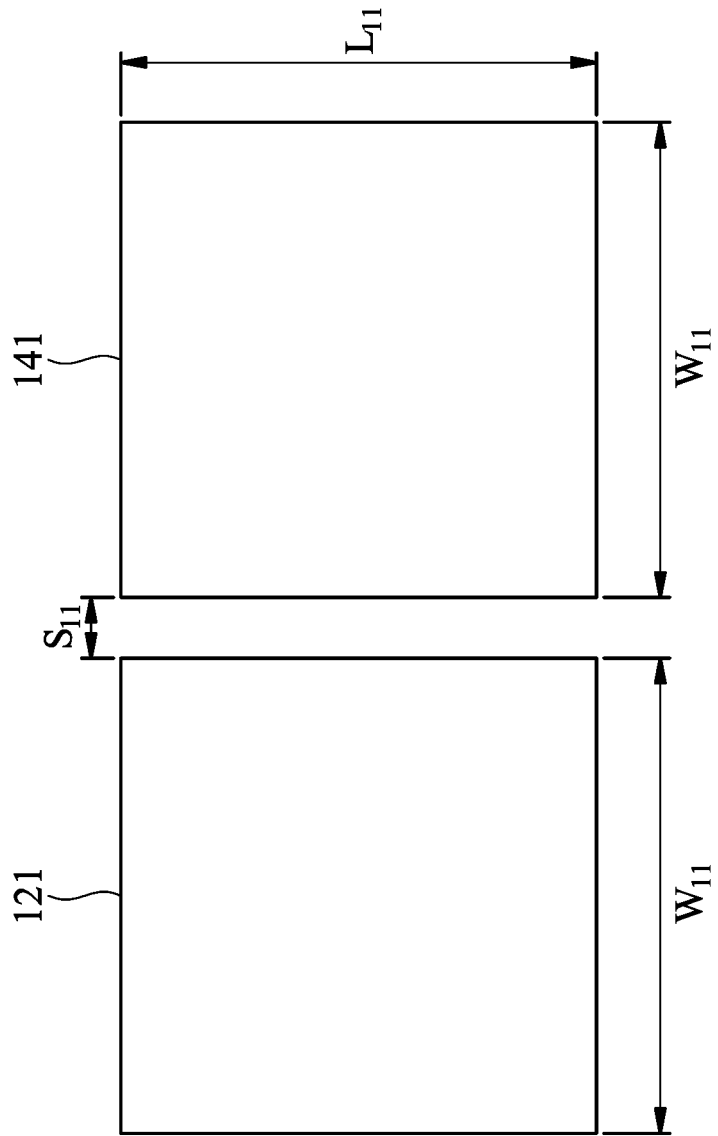
FIG. 3A shows an example of structures of a first electrode and a second electrode implemented in an MISIM according to embodiments of the present disclosure.
Figure 3B:
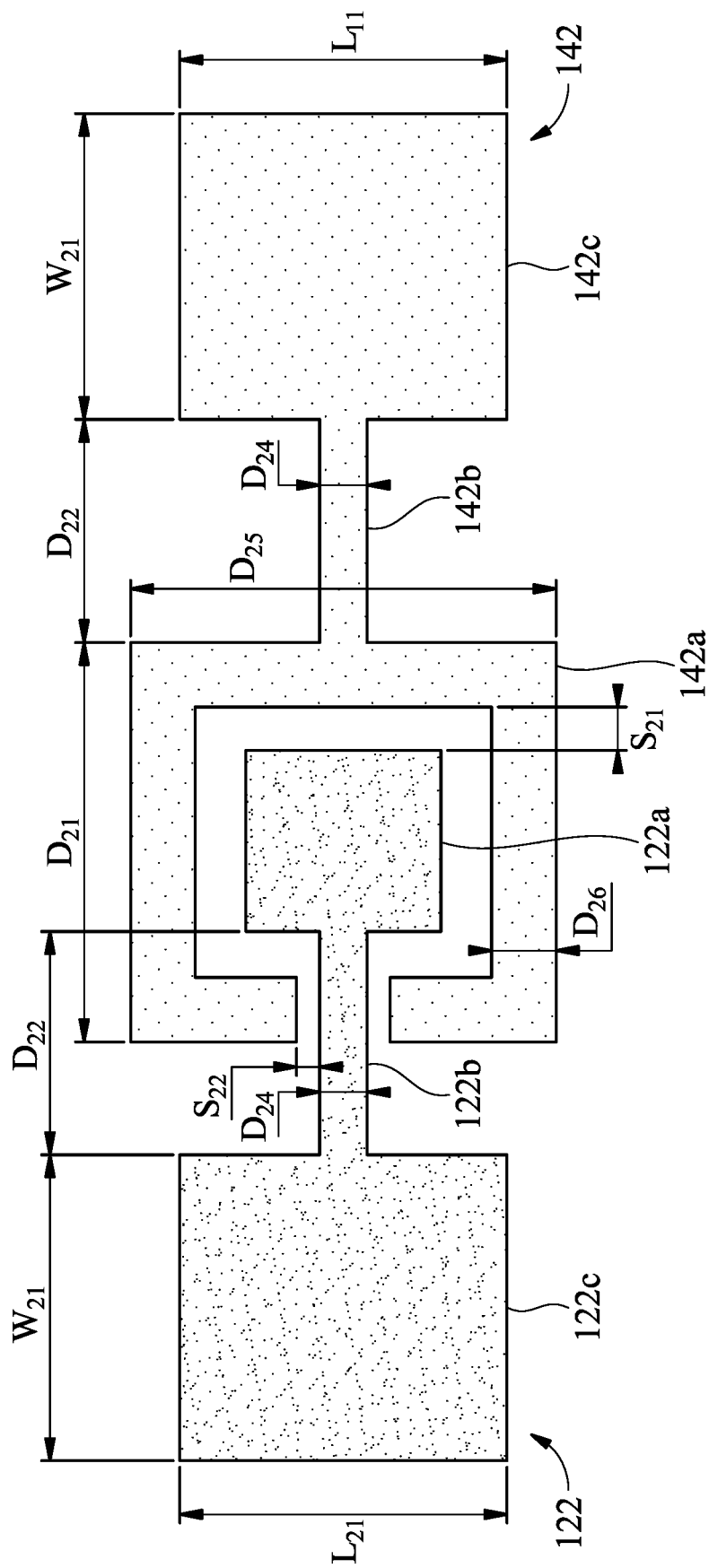
FIG. 3B shows an example of structures of a first electrode and a second electrode implemented in an MISIM according to embodiments of the present disclosure.
Figure 3C:
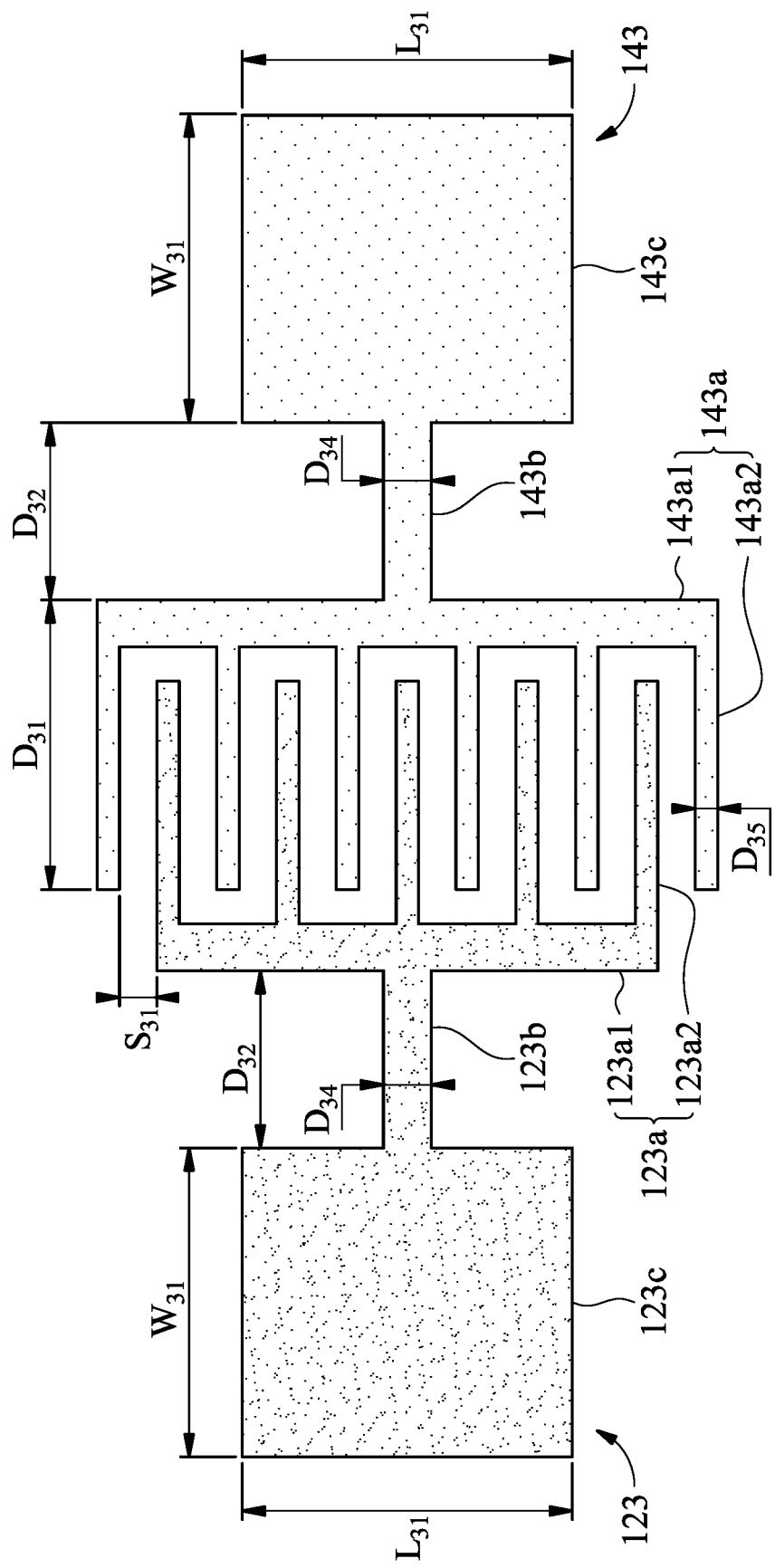
FIG. 3C shows an example of structures of a first electrode and a second electrode implemented in an MISIM according to embodiments of the present disclosure.

As described above, the first electrode I has a circular shape, and the second electrode R has a ring shape surrounding the first electrode I and is spaced-apart from the first electrode I by the distance S. The structures of the first electrode I and the second electrode R, however, are not limited thereto. FIGS. 3A-3C show other examples of the structures of the first electrode and the second electrode.

Referring to FIG. 3A, a first electrode 121 and a second electrode 141 each have a rectangular shape according to some embodiments. In some embodiments, the first electrode 121 and the second electrode have a height (or a length) $L_{11}$ of about 20 nm to about 300 µm, and the first electrode 121 and the second electrode 141 have a width $W_{11}$ of about 20 nm to about 300 µm. In some embodiments, sides of the first electrode 121 and the second electrode 141 are parallel to each other and are spaced apart from each other by a distance $S_{11}$ of about 5 nm to about 30 µm. In some embodiments, the height (or the length) $L_{11}$ of the first electrode 121 and the second electrode 141 is about 50 nm to about 20 µm, the width $W_{11}$ of the first electrode 121 and the second electrode 141 is about 50 nm to about 20 µm, and the distance $S_{11}$ between the first electrode 121 and the second electrode 141 is about 20 nm to about 1 µm. The size of the first electrode 121, the distance $S_{11}$, and the size of the second electrode 141 should not be limited thereto, and can be modified according to design particulars.

Referring to FIG. 3B, a first electrode 122 includes an inner electrode 122a partially surrounded by an outer electrode 142a of a second electrode 142, according to some embodiments. The first electrode 122 further includes a contact electrode 122c connected to the inner electrode by a connection electrode 122b, and the second electrode 142 further includes a contact electrode 142c connected to the outer electrode by a connection electrode 142b. The contact electrodes 122c and 142c of the first electrode 122 and the second electrode 142 have a rectangular shape having a length $L_{21}$ of about 100 µm to about 400 µm, and a width $W_{21}$ of about 100 µm to about 400 µm, in some embodiments. The connection electrodes 122b and 142b of the first electrode 122 and the second electrode 142 have a width $D_{24}$ of about 50 nm to about 50 µm and a length $D_{22}$ of about 1 µm to about 200 µm, in some embodiments. In some embodiments, the outer portion 142a of the second electrode 142 partially surrounding the inner electrode 122a of the first electrode 122 has a length $D_{25}$ of about 1 µm to about 200 µm and a width $D_{21}$ of about 200 nm to about 500 µm. In some embodiments, a distance $S_{21}$ between an inner edge of the outer electrode 142a of the second electrode 142 and an edge of the inner electrode 122a of the first electrode 122 is about 5 nm to about 30 µm, and a distance $S_{22}$ between the outer electrode 142a of the second electrode 142 and the connection electrode 122b of the first electrode 122 is about 5 nm to about 30 µm. The size of the first electrode 122, the distances $S_{21}$ and $S_{22}$, and the size of the second electrode 142 should not be limited thereto and can be modified according to design particulars.

Referring to FIG. 3C, a first electrode 123 and a second electrode 143 constitute a comb-shaped arrays according to some embodiments. The first electrode 123 and the second electrode 143 can include a comb-shaped element 123a and a comb-shaped element 143a, respectively. In these embodiments, the comb-shaped element 123a includes a comb head portion 123a1 and elongated members 123a2 extending from the comb head portion 123a1. Similarly, the comb-shaped element 143a includes a comb head portion 143a1 and elongated members 143a2 extending from the comb head portion 143a1. In the embodiment represented in FIG. 3C, the elongated members 123a2 are interleaved with and spaced apart from the elongated members 143a2. A length $D_{31}$ of each electrode 123a or 143a of the comb-shaped arrays is about 200 nm to about 500 µm, in some embodiments. A width $D_{35}$ of the elongated member 123a2/143a2 is about 50 nm to about 100 µm, in some embodiments. A distance $S_{31}$ between adjacent elongated member 123a2 and 143a2 of the comb-shaped arrays is about 5 nm to about 30 µm, in some embodiments. The first electrode 123 and the second electrode 143 respectively include contact electrodes 123c and 143c having a length $L_{31}$ of about 100 µm to about 400 µm and a width $W_{31}$ of about 100 µm to about 400 µm, in some embodiments. The first electrode 123 and the second electrode 143 respectively further include connection portions 123b and 143b connecting the respective contact electrodes 123c and 143c to the respective comb head portions 123a1 and 143a1 and having a length $D_{32}$ of about 1 µm to about 200 µm and a width $D_{34}$ of about 50 nm to about 50 µm, in some embodiments. The number of comb-shaped structure pairs (each pair includes one elongated member 123a2 and one elongated member 143a2 adjacent to each other) of the comb-shaped arrays can be from 10 to 10,000 or from 10 to 100, in some embodiments. The size of the first electrode 143, the distances $S_{31}$, the size of the second electrode 143, and the number of the comb-shaped structure pairs of the com-shaped arrays should not be limited thereto and can be modified according to design particulars.

The structures of the first electrode and the second electrode, however, are not limited to the above examples with reference to FIGS. 1-3C. In some embodiments, any two electrodes spaced-apart from each other by a predetermined distance can be implemented as the first electrode and the second electrode.

In the following, for convenience, the structures of the first electrode and the second electrode shown in FIGS. 1 and 2 will be described below as an example. The above-described other examples of the first electrode and the second electrode can be used to modify the example to be described below, as would be appreciated by one of skill in the art.

Figure 4A:
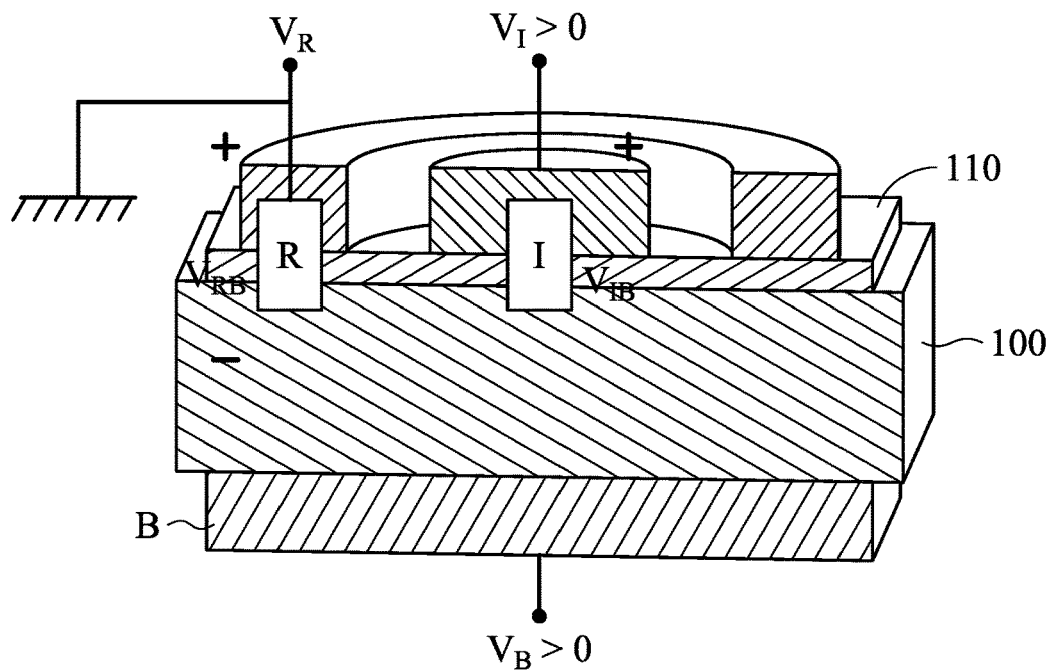
FIG. 4A shows a state of an MISIM according to embodiments of the present disclosure, in which relative potential is applied to a first electrode, a second electrode, and a back electrode of the FIG. 4B shows a bandgap diagram of the MISIM according to embodiments of the present disclosure, in a case in which the relative potential shown in FIG. 4A is applied to the MISIM.
Figure 4B:
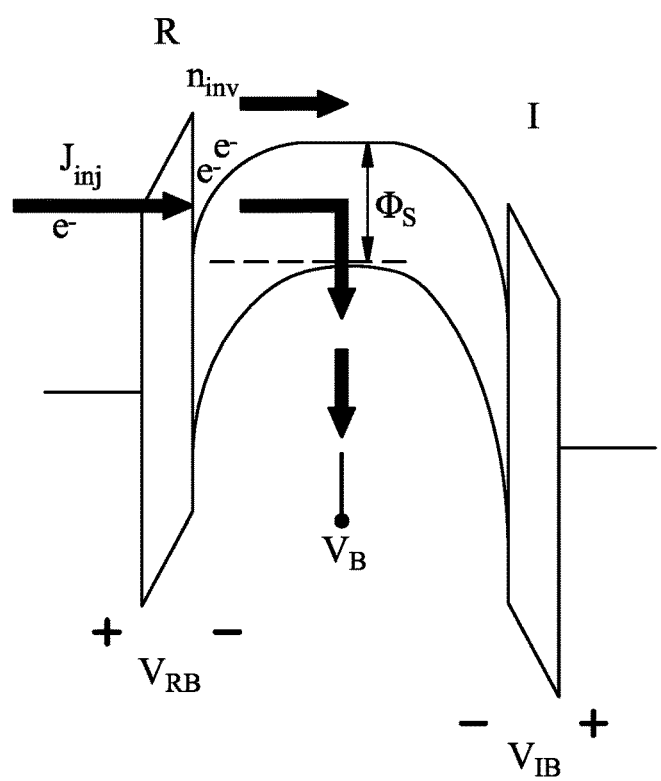

FIG. 4A shows a state of the MISIM according to embodiments of the present disclosure, in which relative potential is applied to the first electrode I, the second electrode R, and the back electrode B. FIG. 4B shows a bandgap diagram of the MISIM, in a case in which the relative potential shown in FIG. 4A is applied to the MISIM.

Referring to the drawings, when the second electrode R is connected to the ground, and the back electrode B and the first electrode I are both connected to, for example, positive potential, with a constant bias $V_{IB}$ between the first electrode I and the back electrode B, current $I_I$ passing through the first electrode I is determined by lateral minority carriers supplied from the second electrode R of the MISIM. According to some embodiments, in a case in which the semiconductor layer 100 is a P-type semiconductor layer, a level of electrons acting as the lateral minority carriers supplied by the second electrode R can be determined at least based on electron injection ($J_{inj}$) from the second electrode R, quantity of the inversion charge (nines) under the second electrode R, and a barrier height $\Phi_S$ for the inversion charges flowing to the insulating layer 110.

According to some embodiments, the MISIM can operate as a negative differential resistance (NDR) with a single peak, in a case in which relative potential applied to the first electrode I, the second electrode R, and the back electrode B satisfies a predetermined relation. For convenience, a mode of operation of a negative differential resistance (NDR) with a single peak will be termed as a single NDR mode. In the following, the MISIM according to embodiments of the present disclosure including a P-type semiconductor layer 100 and the first electrode I and the second electrode R thereof having flatband $V_{FB}$ satisfying $V_{FB}<0$ will be described as an example.

Figure 5A:
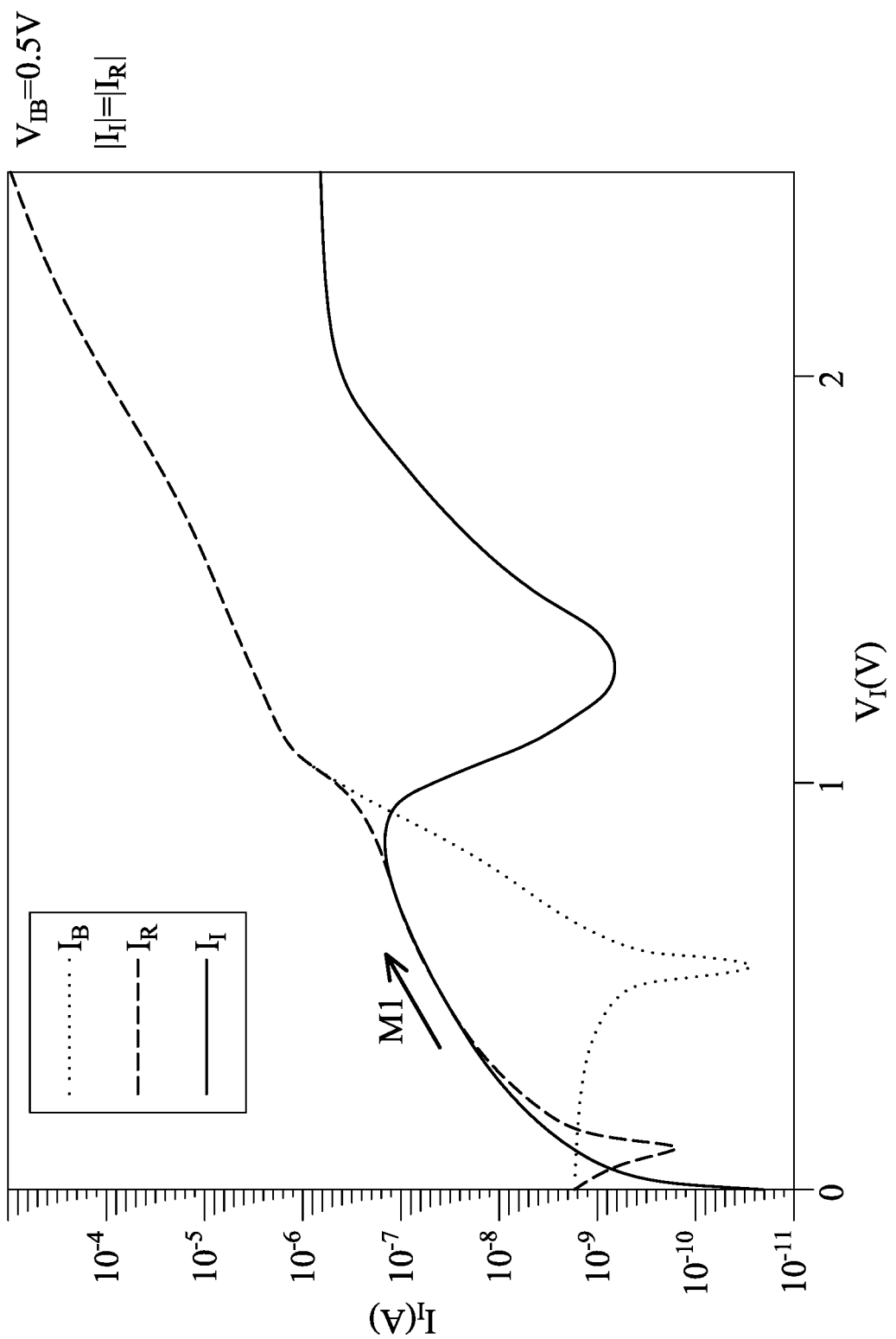
FIG. 5A shows current $I_B$, $I_R$, and $I_I$ respectively passing through a back electrode, a second electrode, and a first electrode of the MISIM according to embodiments of the present disclosure, in response to a voltage $V_I$ applied to the first electrode sweeping from a reference voltage to a predetermined voltage, with a bias $V_{IB}$ applied between the first electrode and the back electrode.
Figure 5B:
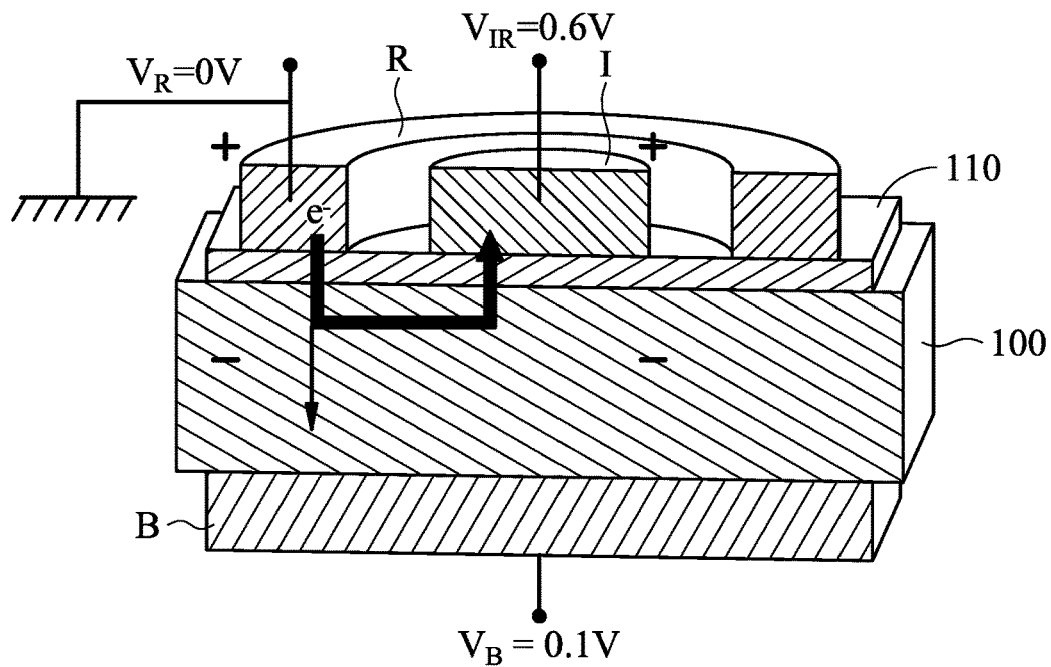
FIG. 5B shows one example of operating the MISIM according to embodiments of the present disclosure, in which $V_I$ (or $V_{IR}$) is 0.6 V.
Figure 5C:
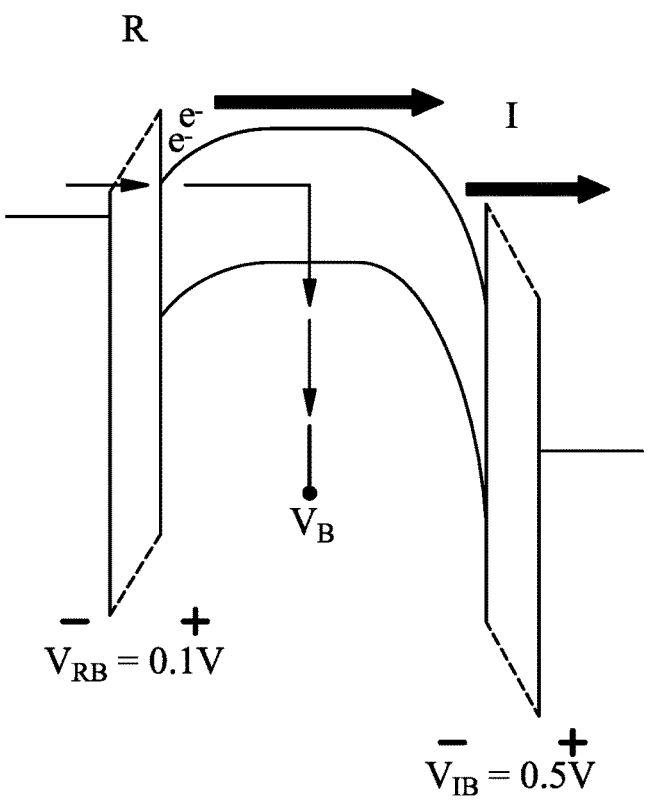
FIG. 5C shows a bandgap diagram of the MISIM according to embodiments of the present disclosure, in which $V_I$ (or $V_{IR}$) is 0.6 V.

FIG. 5A shows current $I_B$, $I_R$, and $I_I$ respectively passing through the back electrode B, the second electrode R, and the first electrode I, in response to a voltage $V_I$ applied to the first electrode I sweeping from a reference voltage, for example, 0 V, to a predetermined voltage, for example, 2.5 V, with a bias $V_{IB}$ of 0.5 V applied between the first electrode I and the back electrode B. For convenience, an arrow M1 is added to FIG. 5A to represent a first trend of the current $I_I$ passing through the first electrode I when $V_I$ sweeps from 0 V to a first predetermined value, for example, about 0.9 V. FIG. 5B shows one example in which $V_I$ (or $V_{IR}$) is 0.6 V, and FIG. 5C shows a bandgap diagram of the MISIM in which $V_I$ (or $V_{IR}$) is 0.6 V.

Referring to FIG. 5A, in a case in which $V_I$ sweeps from 0 V to about 0.9 V, the absolute value of the current $I_I$ passing through the first electrode I increases and is substantially equal to the absolute value of the current $I_R$ passing through the second electrode R. Thus, in a case in which $V_I$ sweeps from 0 V to about 0.9 V, the MISIM acts as a positive differential resistance. Referring to the bandgap diagram shown in FIG. 5C, the inversion charges, i.e., electrons, under the second electrode R flow to the first electrode.

Figure 6A:
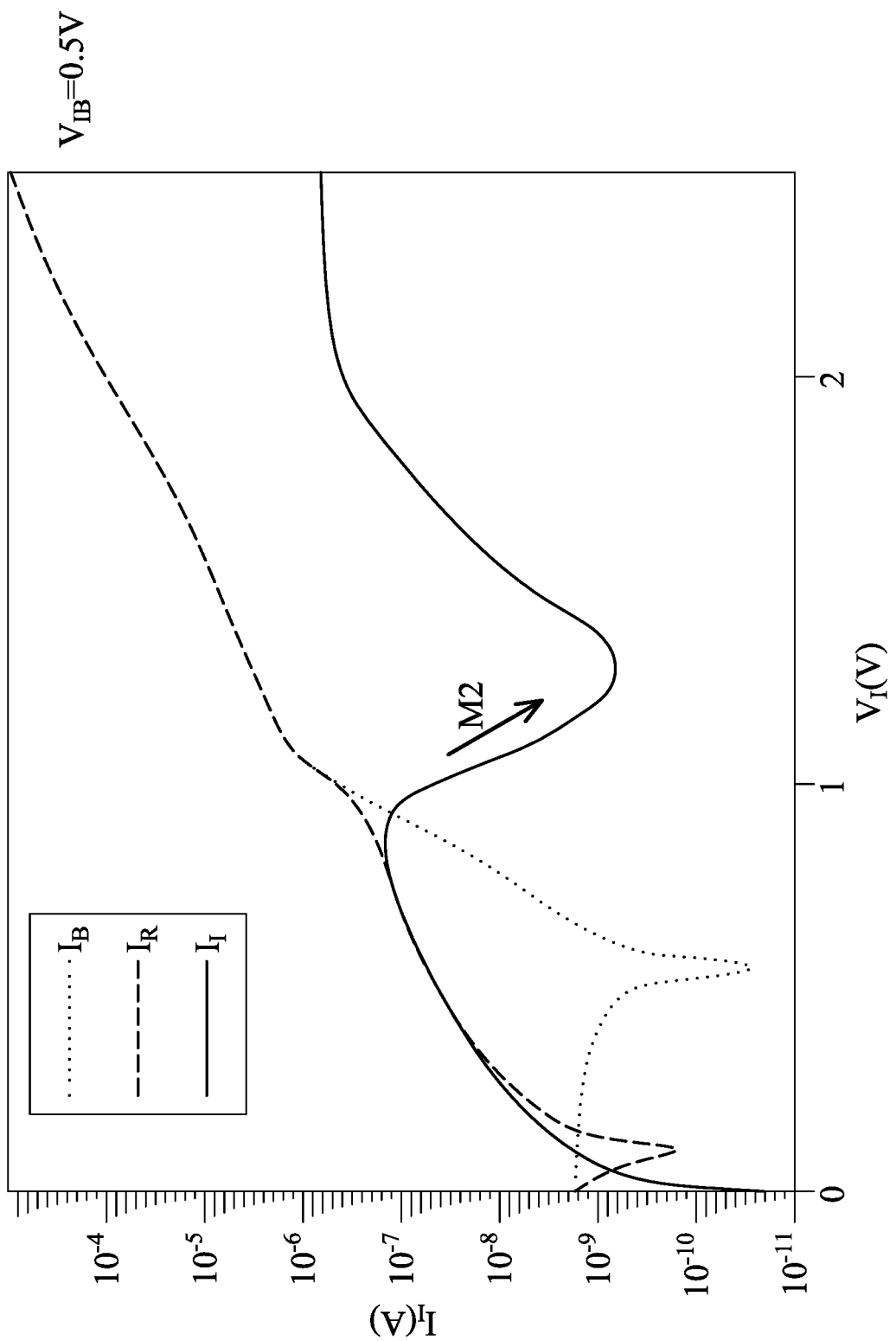
FIG. 6A shows current $I_B$, $I_R$, and $I_I$ respectively passing through a back electrode, a second electrode, and a first electrode of the MISIM according to embodiments of the present disclosure, in response to a voltage $V_I$ applied to the first electrode sweeping from a reference voltage to a predetermined voltage, with a bias $V_{IB}$ applied between the first electrode and the back electrode.
Figure 6B:
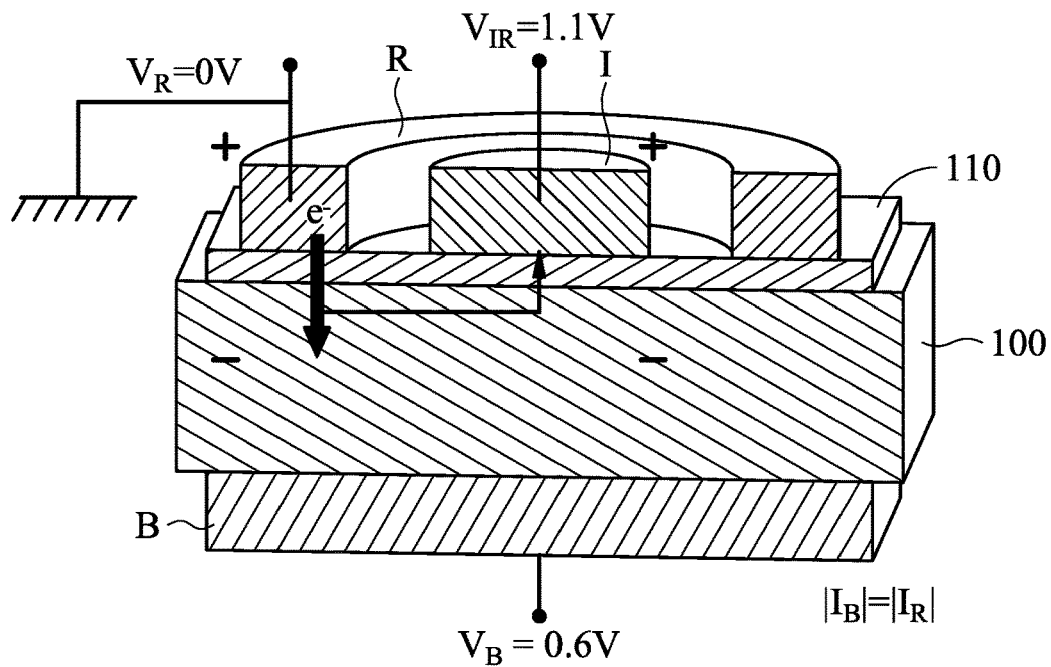
FIG. 6B shows one example of operating the MISIM according to embodiments of the present disclosure, in which $V_I$ (or $V_{IR}$) is 1.1 V.
Figure 6C:
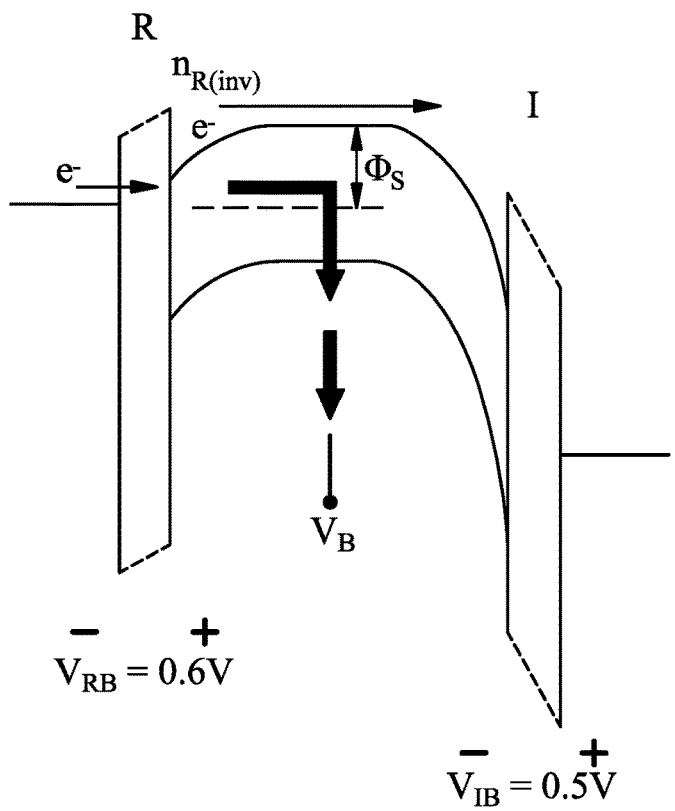
FIG. 6C shows a bandgap diagram of the MISIM according to embodiments of the present disclosure, in which $V_I$ (or $V_{IR}$) is 1.1 V.

FIG. 6A shows the same content as that shown in FIG. 5A, except that an arrow M2 is used in FIG. 6A to represent a second trend of the current $I_I$ passing through the first electrode I when $V_I$ sweeps from the first predetermined voltage, for example, about 0.9 V, to a second predetermined voltage, for example, about 1.2 V. FIG. 6B shows one example in which $V_I$ (or $V_{IB}$) is 1.1 V, and FIG. 6C shows a bandgap diagram of the MISIM in which $V_I$ (or $V_{IR}$) is 1.1 V.

Referring to FIG. 6B, in a case in which $V_I$ sweeps from about 0.9 V to about 1.2 V, the absolute value of the current $I_R$ passing through the second electrode R is substantially equal to the absolute value of the current $I_B$ passing through the back electrode B, and the absolute value of the current $I_I$ passing through the first electrode I decreases. Thus, in a case in which $V_I$ sweeps from about 0.9 V to about 1.1 V, the MISIM acts as a negative differential resistance. Referring to the bandgap diagram shown in FIG. 6C, relative high energy inversion charges under the second electrode R flow to the back contact B. Since the lateral inversion charge current density $J_{inv}$ and the barrier height $\Phi_S$ are relatively lower, the inversion charges ($n_{inv}$) under the second electrode R dominate the supply of the minority carriers to the first electrode I.

Figure 7A:
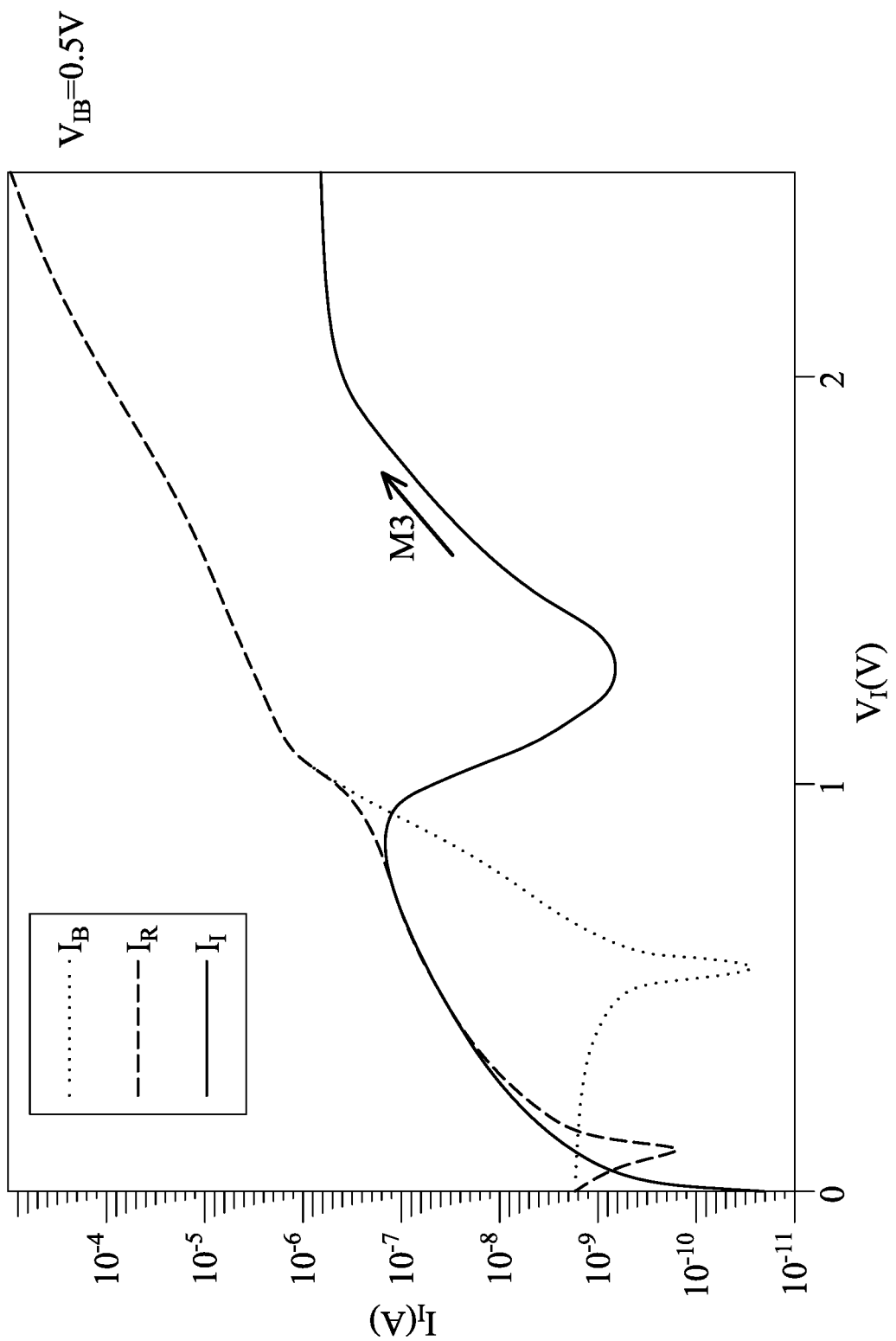
FIG. 7A shows current $I_B$, $I_R$, and $I_I$ respectively passing through a back electrode, a second electrode, and a first electrode of the MISIM according to embodiments of the present disclosure, in response to a voltage $V_I$ applied to the first electrode sweeping from a reference voltage to a predetermined voltage, with a bias $V_{IB}$ applied between the first electrode and the back electrode.
Figure 7B:
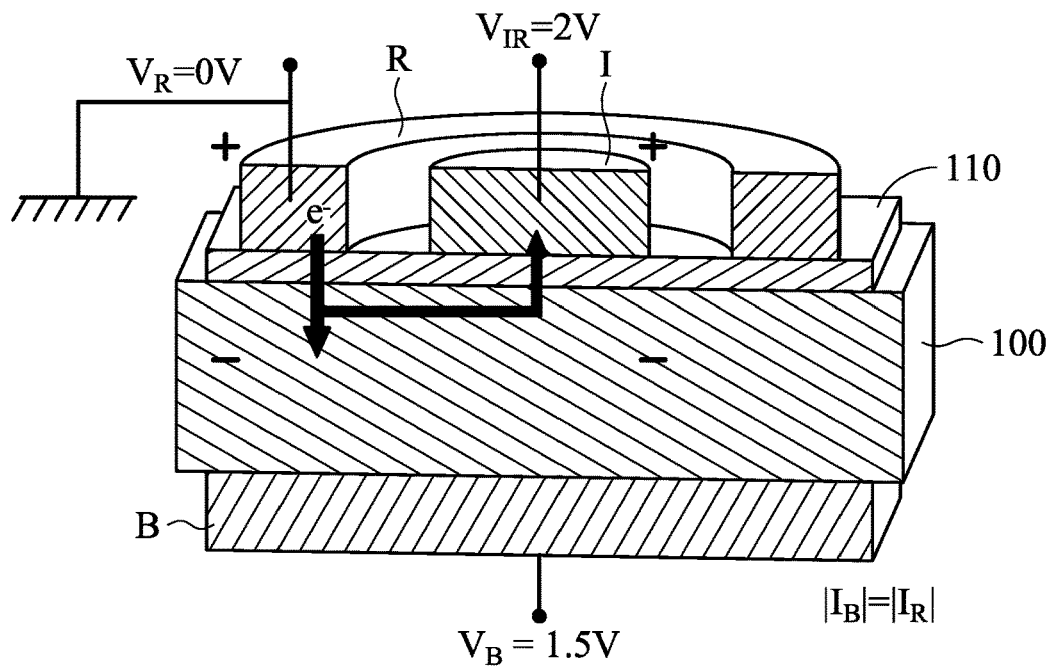
FIG. 7B shows one example of operating the MISIM according to embodiments of the present disclosure, in which $V_I$ (or $V_{IR}$) is 2 V.
Figure 7C:
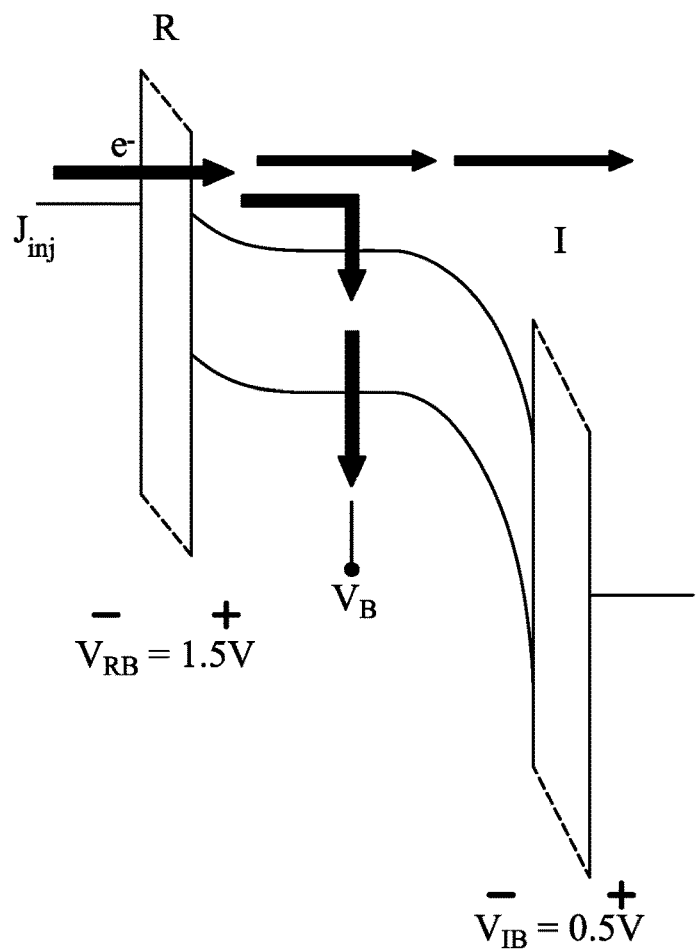
FIG. 7C shows a bandgap diagram of the MISIM according to embodiments of the present disclosure, in which $V_I$ (or $V_{IR}$) is 2 V.

FIG. 7A shows the same content as that shown in FIG. 5A, except that an arrow M3 is used in FIG. 7A to represent a third trend of the current $I_I$ passing through the first electrode I when $V_I$ sweeps from the second predetermined voltage, for example, about 1.2 V to a third predetermined voltage, for example, about 2.5 V. FIG. 7B shows one example in which $V_I$ (or $V_{IB}$) is 2 V, and FIG. 7C shows a bandgap diagram of the MISIM in which $V_I$ (or $V_{IR}$) is 2 V.

Referring to FIG. 7A, in a case in which $V_I$ sweeps from about 1.2 V to about 2.5 V, the absolute value of the current $I_R$ passing through the second electrode R is substantially equal to the absolute value of the current $I_B$ passing through the back electrode B, and the absolute value of the current $I_I$ passing through the first electrode I increases. Thus, in a case in which $V_I$ sweeps from about 1.2 V to about 2.5 V, the MISIM acts as a positive differential resistance. Referring to the bandgap diagram shown in FIG. 7C, a relatively large lateral electron injection dominates the supply of the minority carriers from the second electrode R to the first electrode I.

Figure 8A:
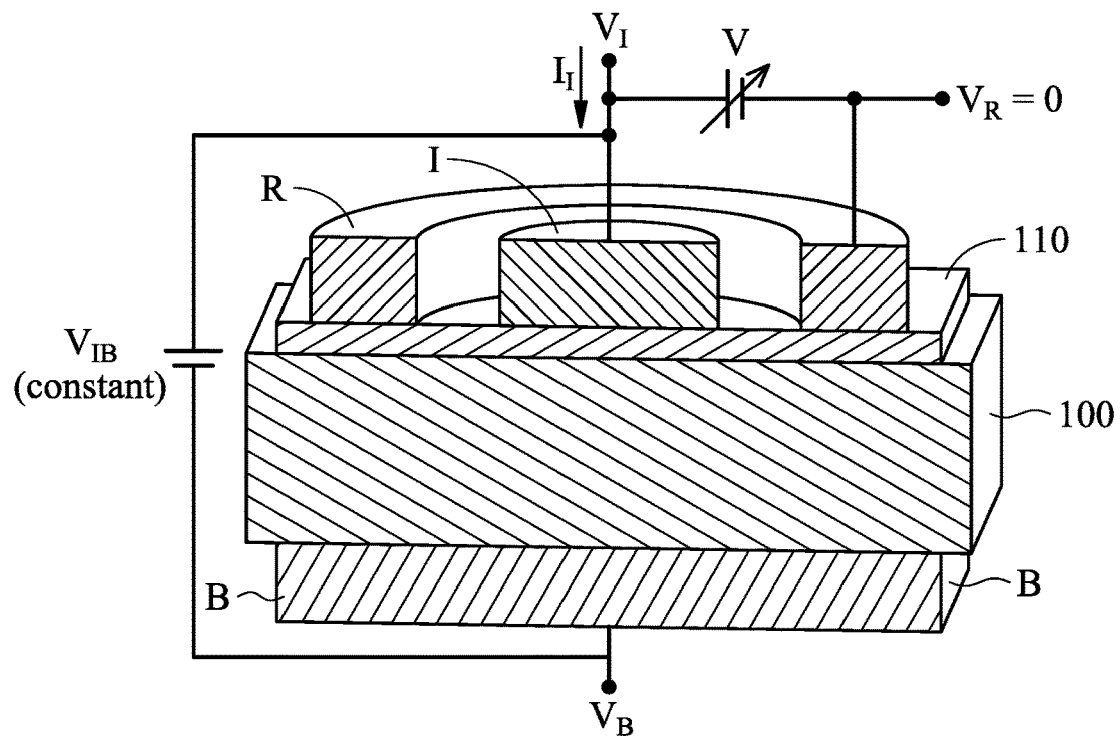
FIG. 8A schematically illustrates relative potential applied to a first electrode, a second electrode, and a back electrode of the MISIM according to embodiments of the present disclosure, to operate the MISIM.
Figure 8B:
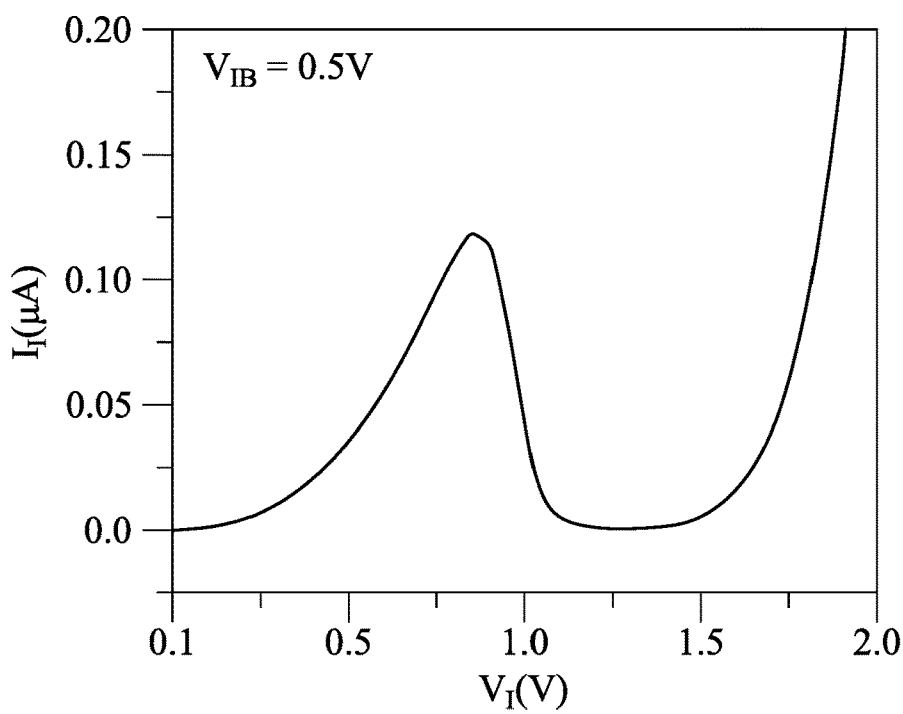
FIG. 8B shows a relation between $I_I$ passing through a first electrode and $V_I$ applied to the first electrode, with a bias $V_{IB}$ applied between the first electrode and a back electrode.

FIG. 8A schematically illustrates relative potential applied to the first electrode I, the second electrode R, and the back electrode B of the MISIM according to embodiments of the present disclosure, to operate the MISIM. FIG. 8B shows a relation between $I_I$ passing the first electrode I and $V_I$ applied to the first electrode I, with a bias $V_{IB}$ of 0.5 V applied between the first electrode I and the back electrode B. One of ordinary skill in the art would understand that the curve $I_I$-$V_I$ shown in FIG. 5A, 6A, or 7A and the curve $I_I$-$V_I$ shown in FIG. 8B are the same as each other except that the upper end of $V_I$ in FIG. 8B is 1.8 V rather than 2.5 V in FIG. 5A, 6A, or 7A, and $I_I$ is in a linear scale in FIG. 8B rather than in a logarithmic scale in FIG. 5A, 6A, or 7A.

Referring to FIG. 8B, $I_I$ passing through the first electrode I has one single peak, in response to $V_I$ applied to the first electrode I sweeping from a reference, for example, 0 V, to a predetermined voltage, for example, 1.8 V. In this regard, the MISIM operates as a single NDR, as in the entire sweeping range from the reference, for example, 0 V, to the predetermined voltage, for example, 2 V, $I_I$, provided as an output signal of the MISIM according to embodiments of the present disclosure, has one peak when $V_I$ is about 0.9 V.

Configurations of relative potential applied to the first electrode I, the second electrode R, and the back electrode B of the MISIM according to embodiments of the present disclosure, are not limited to the above examples described with reference to FIGS. 5A-8B, such that the MISIM according to embodiments of the present disclosure operates as a single NDR. According to some embodiments, the bias $V_{IB}$ between the first electrode I and the back electrode B can be adjusted according to design particulars, thereby adjusting the peak of $I_I$ passing through the first electrode I and the corresponding voltage of $V_I$.

Figure 8C:
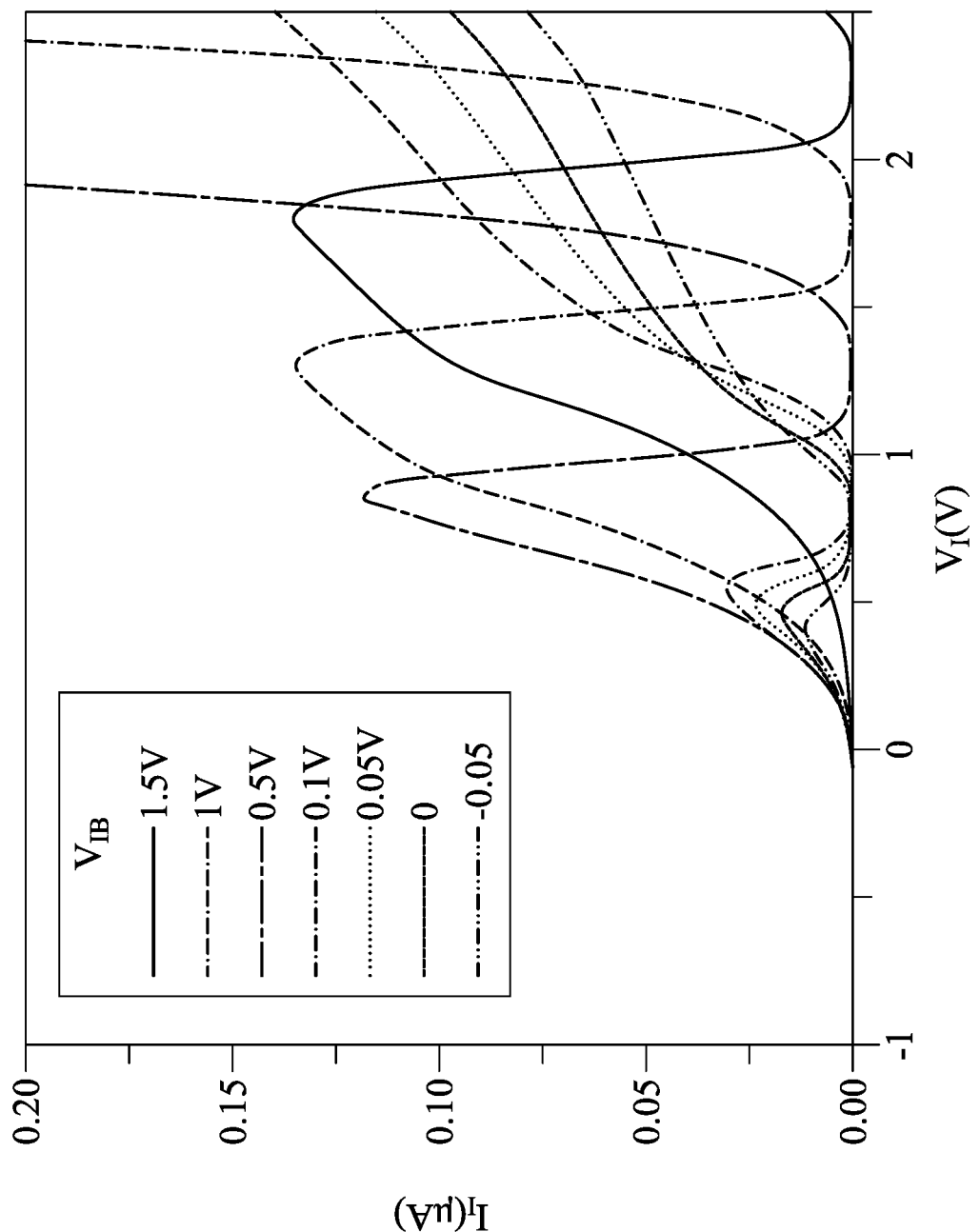
FIG. 8C shows that the MISIM according to embodiments of the present disclosure operates in a single negative differential resistance (NDR) mode, when $V_{IB}$ of −0.05 V, 0 V, 0.05 V, 0.1 V, 0.5 V, 1 V, or 1.5 V is applied.

For example, FIG. 8C shows that, by applying $V_{IB}$ of −0.05 V, 0 V, 0.05 V, 0.1 V, 1 V, or 1.5 V, as well as 0.5 V as described above, the MISIM according to embodiments of the present disclosure can operate as a single NDR. With a different value of $V_{IB}$, a different peak of $I_I$ passing through the first electrode I and a different corresponding voltage of $V_I$ can be obtained. According to some embodiments, one among the exemplary $I_I$-$V_I$ curves shown in FIG. 8C can be selected by selecting the corresponding $V_{IB}$, such that the MISIM operates based on the selected $I_I$-$V_I$, according to design particulars. One of ordinary skill in the art would understand that the curves shown in FIG. 8C are merely examples. In other embodiments, any other value of $V_{IB}$, i.e., a constant value other than the above examples but between a lower limit, for example, −0.05 V and an upper limit, for example, 1.5 V, is used.

Figure 8D:
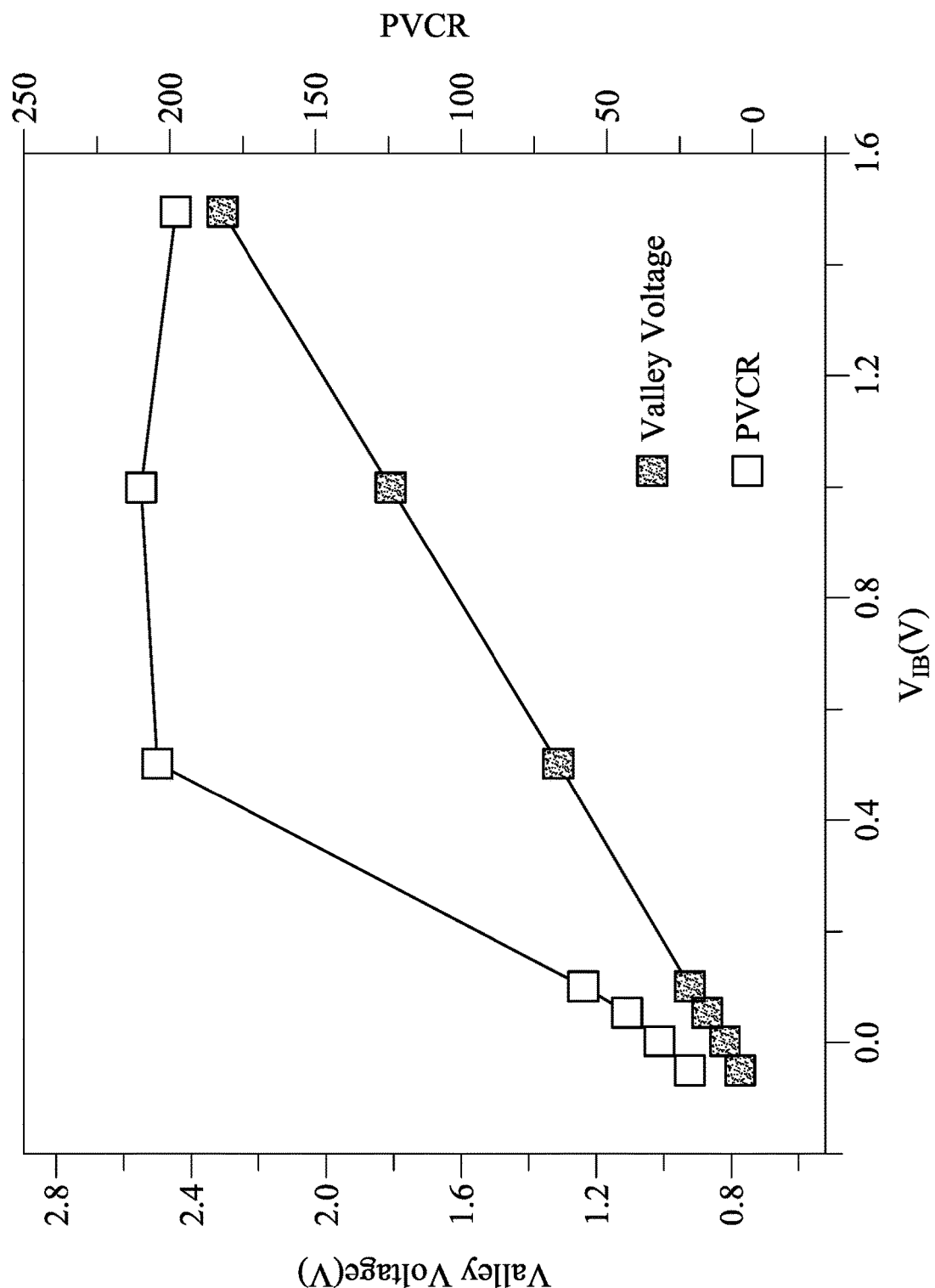
FIG. 8D shows a relation between valley current of $I_I$ passing through a first electrode and a bias $V_{IB}$ applied between the first electrode and a back electrode and a relation between peak-to-valley current ratio (PVCR) of $I_I$ passing through the first electrode and the bias $V_{IB}$ applied between the first electrode and the back electrode.

FIG. 8D shows a relation between valley current of $I_I$ passing through the first electrode I and the bias $V_{IB}$ applied between the first electrode I and the back electrode B and a relation between peak-to-valley current ratio (PVCR) of $I_I$ passing through the first electrode I and the bias $V_{IB}$ applied between the first electrode I and the back electrode B. The values of the valleys shown in FIG. 8D are the values of the valleys of a plurality of curves shown in FIG. 8C. One of ordinary skill in the art would understand that the values of the peak and the valley used to calculate the PVCR are the values of the same curve selected from the plurality of curves shown in FIG. 8C. In some embodiments, the PVCR of $I_I$ passing through the first electrode I is tuned greater than 10 or even greater than 50.

As described above, the MISIM according to embodiments of the present disclosure operates as a single NDR device, in response to the above-described relative potential applied to the terminals such as the first electrode I, the second electrode R, and the back electrode B. One of ordinary skill in the art would understand that the relative potential applied to the first electrode I and the second electrode R can be exchanged, and in this case, $I_R$ passing through the second electrode R becomes an output signal of the MISIM, similar to $I_I$ described above with reference to FIGS. 4A-8D.

Operation modes of the MISIM according to embodiments of the present disclosure are not limited to the above-described single NDR mode. In some embodiments, the MISIM according to embodiments of the present disclosure operates in a dual NDR mode. These features will be more apparent with reference to FIGS. 9-13D described below.

Figure 9:
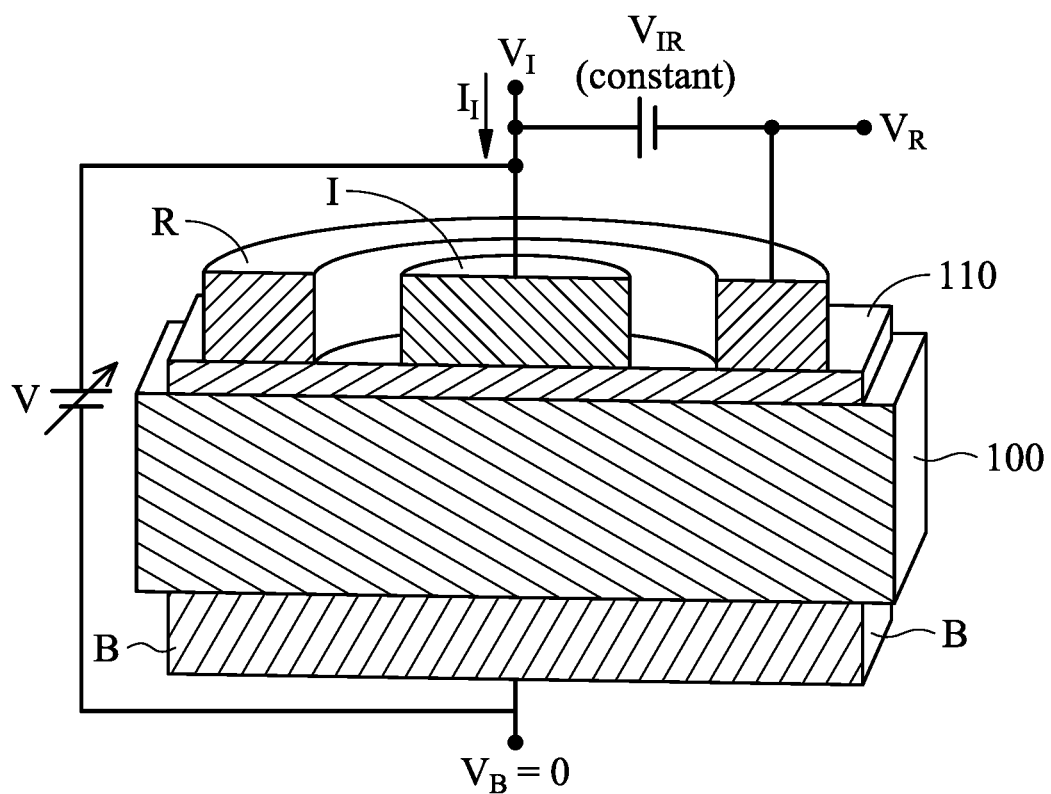
FIG. 9 shows a state of the MISIM according to embodiments of the present disclosure, in which relative potential is applied to a first electrode, a second electrode, and a back electrode, such that the MISIM operates in a dual negative differential resistance (NDR) mode.

FIG. 9 shows a state of the MISIM according to embodiments of the present disclosure, in which relative potential is applied to the first electrode I, the second electrode R, and the back electrode B, such that the MISIM operates in a dual NDR mode.

Referring to FIG. 9, in a case in which the back electrode B is connected to the ground, and the first electrode I and the second electrode R are connected with a constant bias $V_{IR}$ therebetween, current $I_I$ passing through the first electrode $I_I$ has two peaks $V_{peak1}$ and $V_{peak2}$ as shown in FIG. 10A, 11A, 12A, or 13A to be described later, when a voltage $V_I$ applied to the first electrode I (or $V_R$ applied to the back electrode B) sweeps.

Figure 10A:
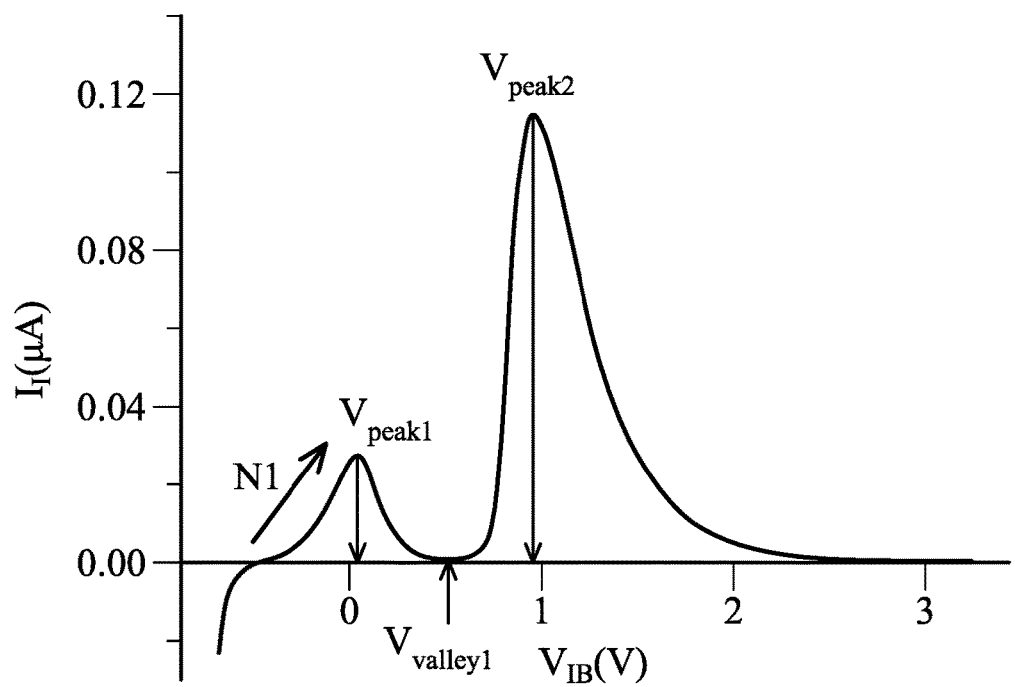
FIG. 10A shows current $I_I$ passing through a first electrode, in response to a voltage $V_I$ applied to the first electrode sweeping from a reference to a predetermined voltage, with a constant bias $V_{IR}$ applied between the first electrode and the second electrode.
Figure 10B:
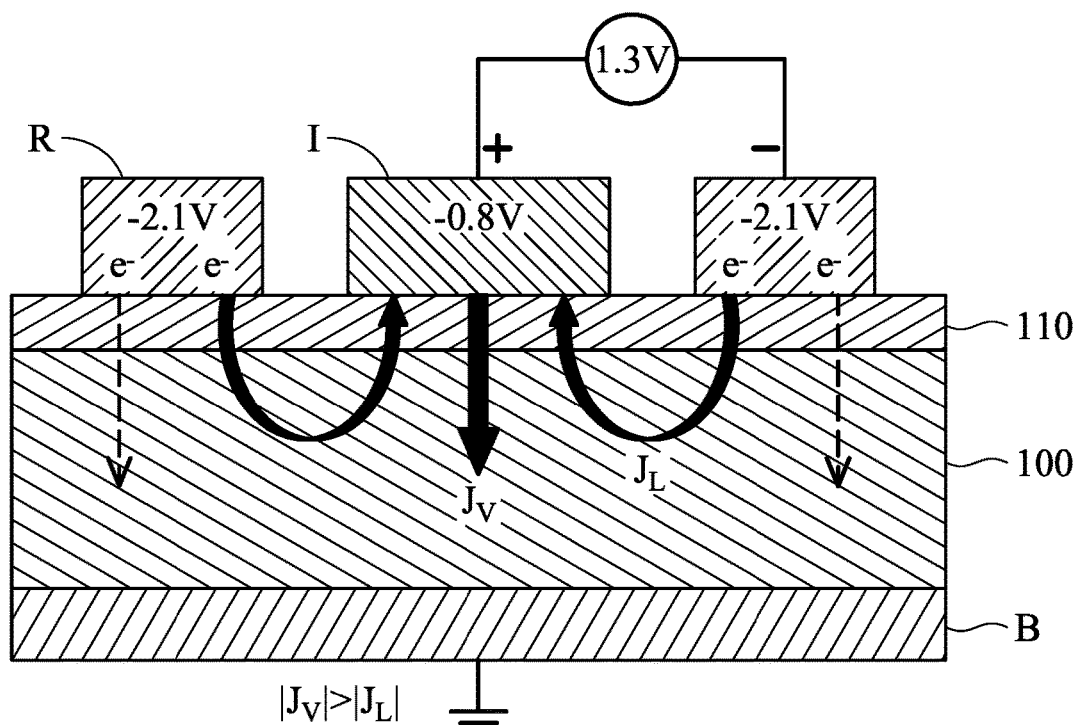
FIG. 10B shows one example of operating the MISIM according to embodiments of the present disclosure, in which $V_I$ (or $V_{IB}$) is −0.8 V.

FIG. 10A shows current $I_I$ passing through the first electrode I, in response to a voltage $V_I$ applied to the first electrode I sweeping from a reference, for example, −0.8 V, to a predetermined voltage, for example, 3 V, with a constant bias $V_{IR}$ of 1.3 V applied between the first electrode I and the second electrode R. For convenience, an arrow N1 is added to FIG. 10A to represent a first trend of the current $I_I$ passing through the first electrode I when $V_I$ sweeps from the reference, for example, −0.8 V, to a first predetermined voltage, for example, 0 V. FIG. 10B shows one example in which $V_I$ (or $V_{IB}$) is −0.8 V.

Referring to FIG. 10A, current $I_I$ passing through the first electrode $I_I$ has two peaks $V_{peak1}$ and $V_{peak2}$ when $V_I$ applied to the first electrode (or the bias $V_{IB}$ between the first electrode I and the back electrode B) is about 0 V and about 1 V, respectively.

Still referring to FIG. 10A, in a case in which $V_I$ (or a bias $V_{IB}$ between the first electrode I and the back electrode B) sweeps from −0.9 V to about 0 V, the absolute value of the current $I_I$ passing through the first electrode I increases and the absolute value of the current density $J_V$ from the first electrode I to the back electrode B is greater than the absolute value of the current density IL from the second electrode B to the first electrode I. That is, vertical current passing through the first electrode I is greater than the lateral current thereof due to a negative $V_{IB}$. Thus, in a case in which $V_I$ sweeps from −0.9 V to about 0 V, the MISIM acts as a positive differential resistance.

Figure 11A:
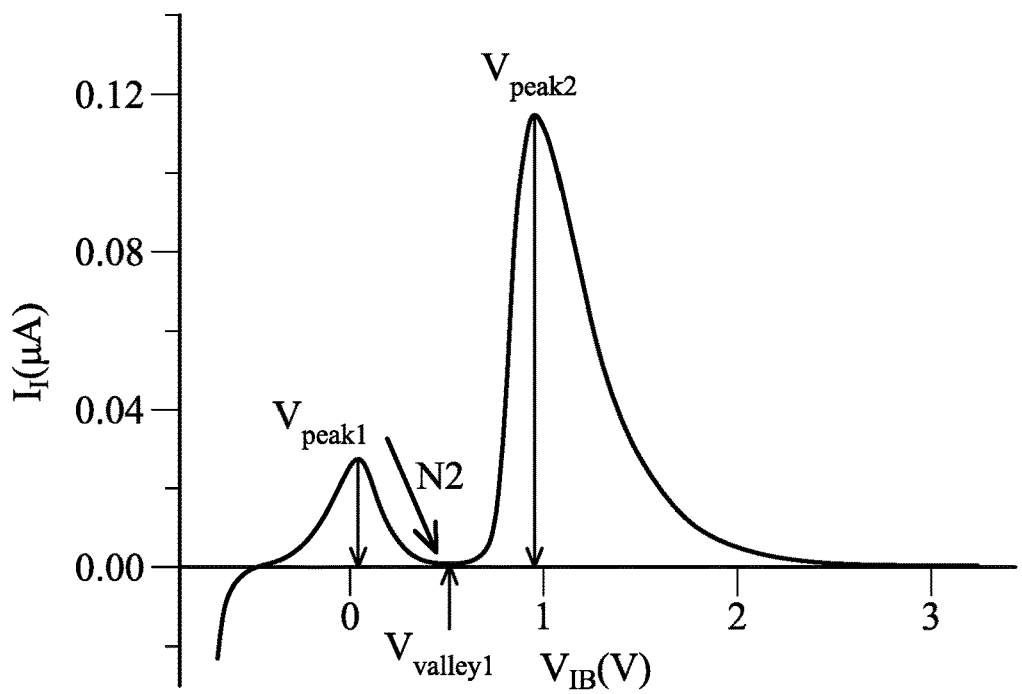
FIG. 11A shows current $I_I$ passing through a first electrode, in response to a voltage $V_I$ applied to the first electrode sweeping from a reference to a predetermined voltage, with a constant bias $V_{IR}$ applied between the first electrode and the second electrode.
Figure 11B:
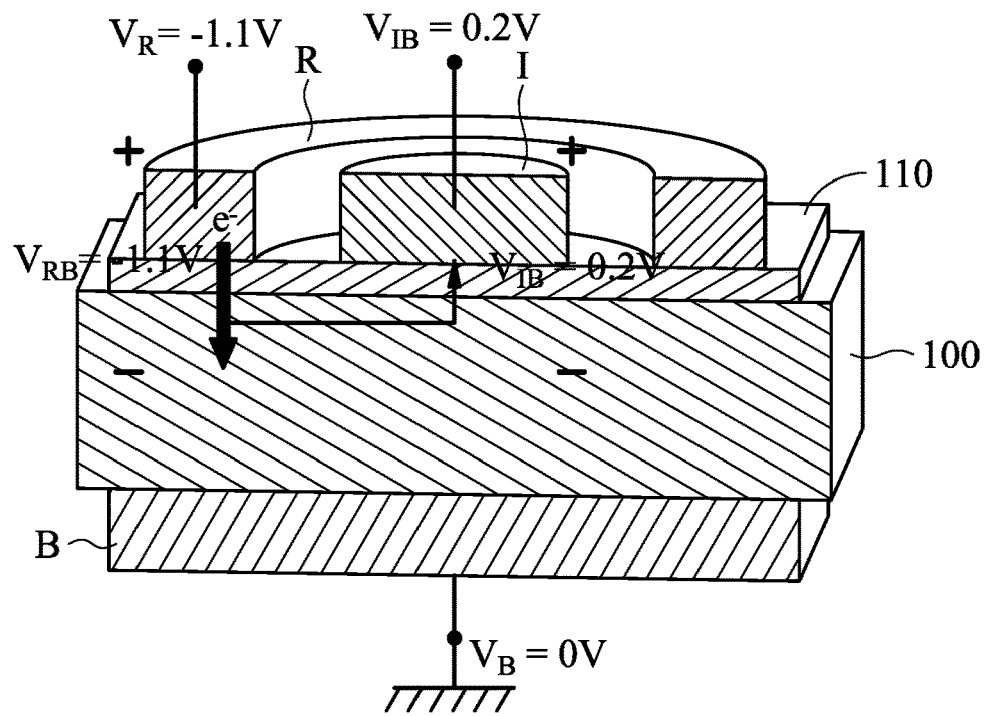
FIG. 11B shows one example of operating the MISIM according to embodiments of the present disclosure, in which $V_I$ (or $V_{IB}$) is 0.2 V.
Figure 11C:
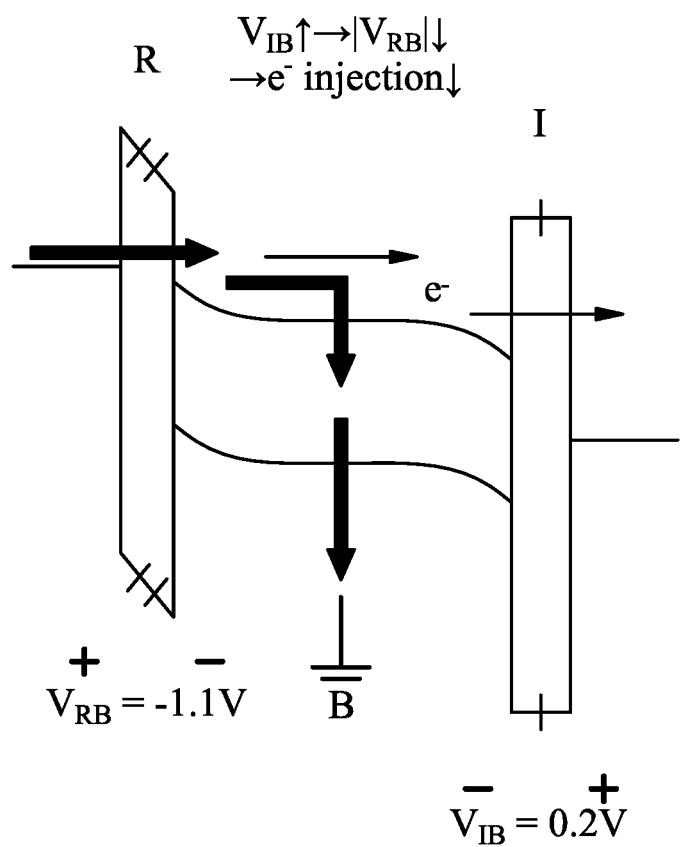
FIG. 11C shows a bandgap diagram of the MISIM according to embodiments of the present disclosure, in which $V_I$ (or $V_{IB}$) is 0.2 V.

FIG. 11A shows the same content as that shown in FIG. 10A, except that an arrow N2 is used in FIG. 11A to represent a second trend of the current $I_I$ passing through the first electrode I when $V_I$ sweeps from the first predetermined voltage, for example, about 0 V, to a second predetermined voltage, for example, about 0.5 V. FIG. 11B shows one example in which $V_I$ (or $V_{IB}$) is 0.2 V, and FIG. 11C shows a bandgap diagram of the MISIM in which $V_I$ (or $V_{IB}$) is 0.2 V.

Referring to the drawings, in a case in which $V_I$ (or a bias $V_{IB}$ between the first electrode I and the back electrode B) sweeps from about 0 V to about 0.5 V, vertical current from the first electrode I is substantially cut off and current $I_I$ passing through the first electrode is dominated by the lateral current. That is, electron injection from the second electrode R dominates the lateral current supplied to the first electrode I. Accordingly, when $V_I$ (or $V_{IB}$) increases from about 0 V to about 0.5 Vs, $V_{RB}$ becomes less negative and $I_I$ decreases. Thus, current $I_I$ passing through the first electrode decreases and the MISIM acts as a negative differential resistance, as indicated by the arrow Na.

Figure 12A:
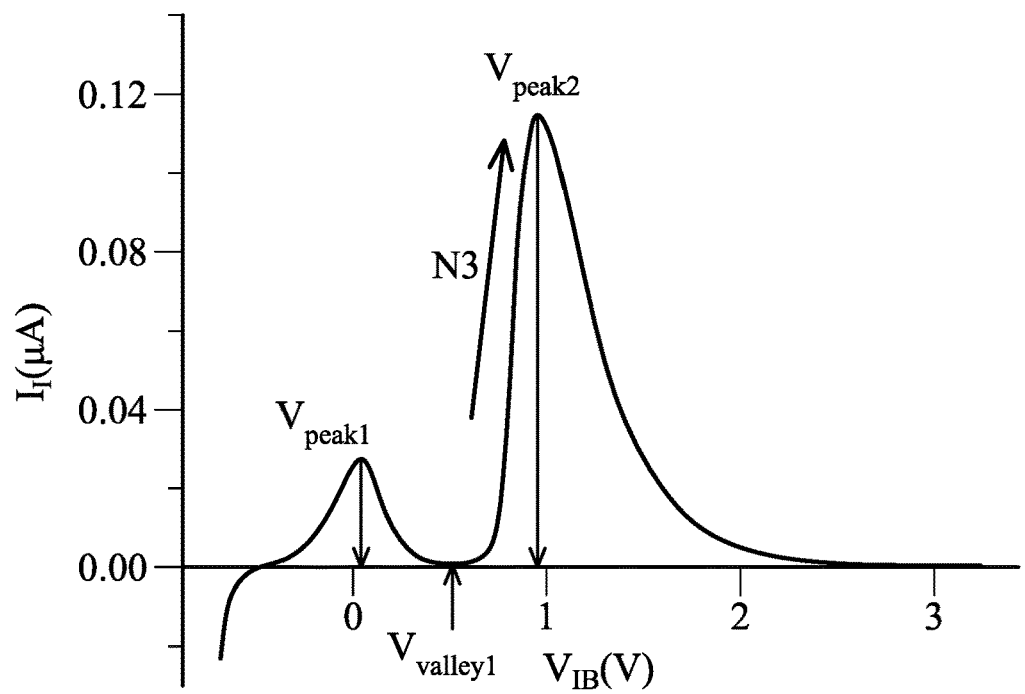
FIG. 12A shows current $I_I$ passing through a first electrode, in response to a voltage $V_I$ applied to the first electrode sweeping from a reference to a predetermined voltage, with a constant bias $V_{IR}$ applied between the first electrode and the second electrode.
Figure 12B:
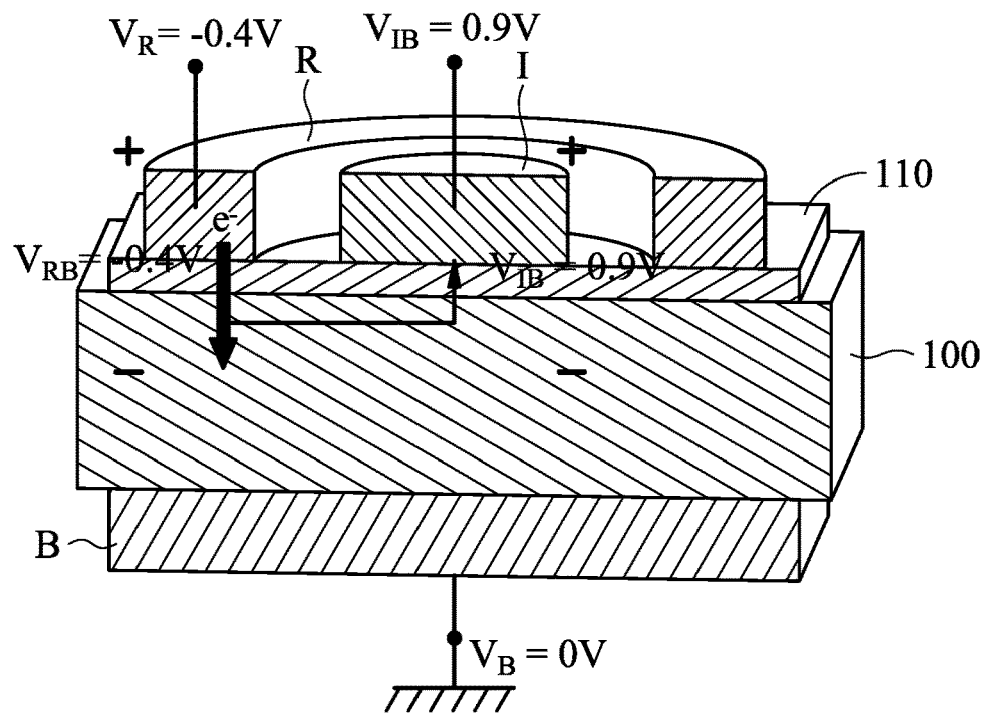
FIG. 12B shows one example of operating the MISIM according to embodiments of the present disclosure, in which $V_I$ (or $V_{IB}$) is 0.9 V.
Figure 12C:
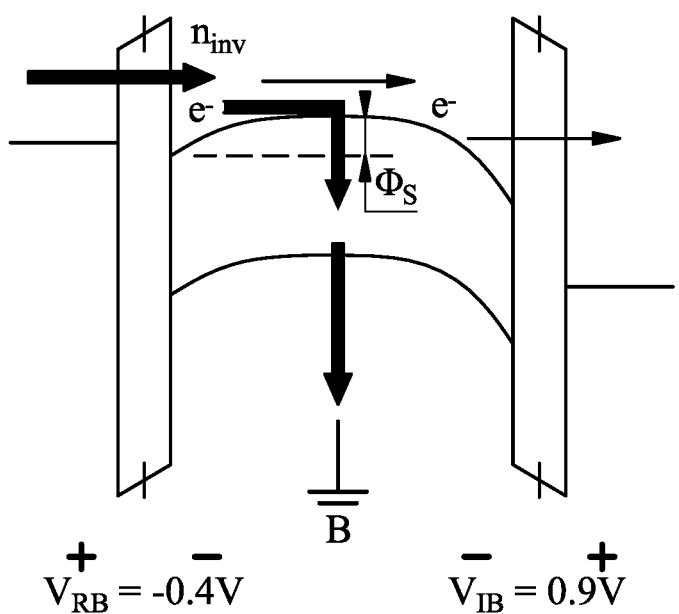
FIG. 12C shows a bandgap diagram of the MISIM according to embodiments of the present disclosure, in which $V_I$ (or $V_{IB}$) is 0.9 V.

FIG. 12A shows the same content as that shown in FIG. 10A, except that an arrow N3 is used in FIG. 11A to represent a third trend of the current $I_I$ passing through the first electrode I when $V_I$ (or $V_{IB}$) sweeps from the second predetermined voltage, for example, about 0.5 V, to a third predetermined voltage, for example, about 1 V. FIG. 12B shows one example in which $V_I$ (or $V_{IB}$) is 0.9 V, and FIG. 12C shows a bandgap diagram of the MISIM in which $V_I$ (or $V_{IB}$) is 0.9 V.

Referring to the drawings, in a case in which $V_I$ (or $V_{IB}$) sweeps from about 0.5 V to about 1 V, inversion charges $n_{inv}$ under the second electrode R increases such that the inversion charges $n_{inv}$ overcome the barrier Os and flow to the first electrode I. On the other hand, electron injection from the second electrode R is relatively low. Thus, when $V_I$ increases, $n_{inv}$ increases such that $I_I$ passing through the first electrode I increases. Accordingly, when $V_I$ (or $V_{IB}$) increases from about 0.5 V to about 1 Vs, current $I_I$ passing through the first electrode increases and the MISIM acts as a positive differential resistance, as indicated by the arrow $N_3$.

Figure 13A:
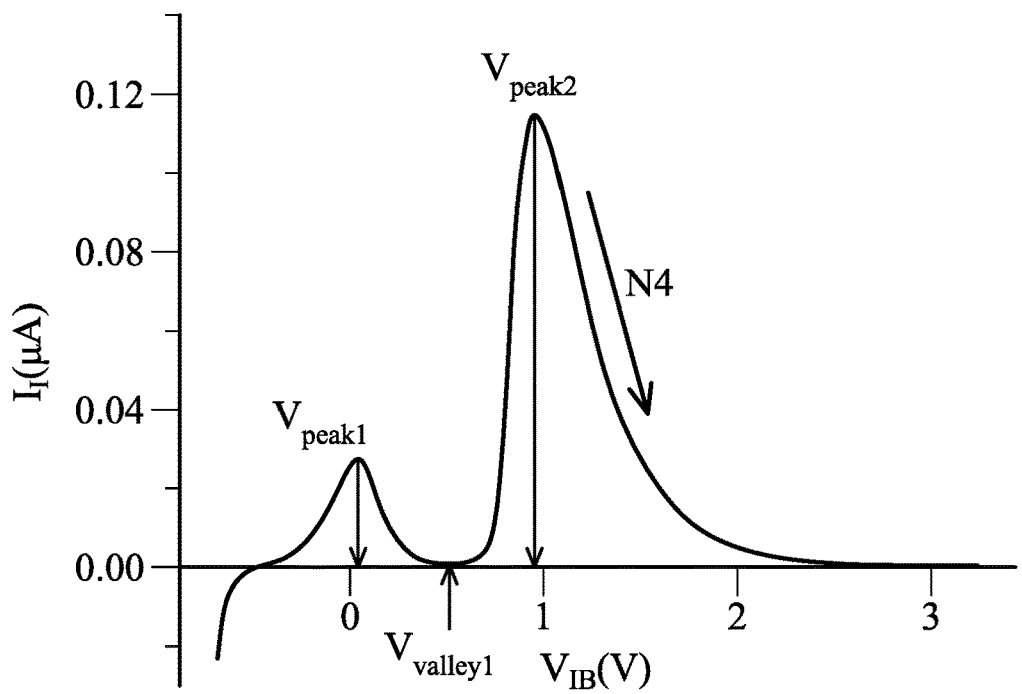
FIG. 13A shows current $I_I$ passing through a first electrode, in response to a voltage $V_I$ applied to the first electrode sweeping from a reference to a predetermined voltage, with a constant bias $V_{IR}$ applied between the first electrode and the second electrode.
Figure 13B:
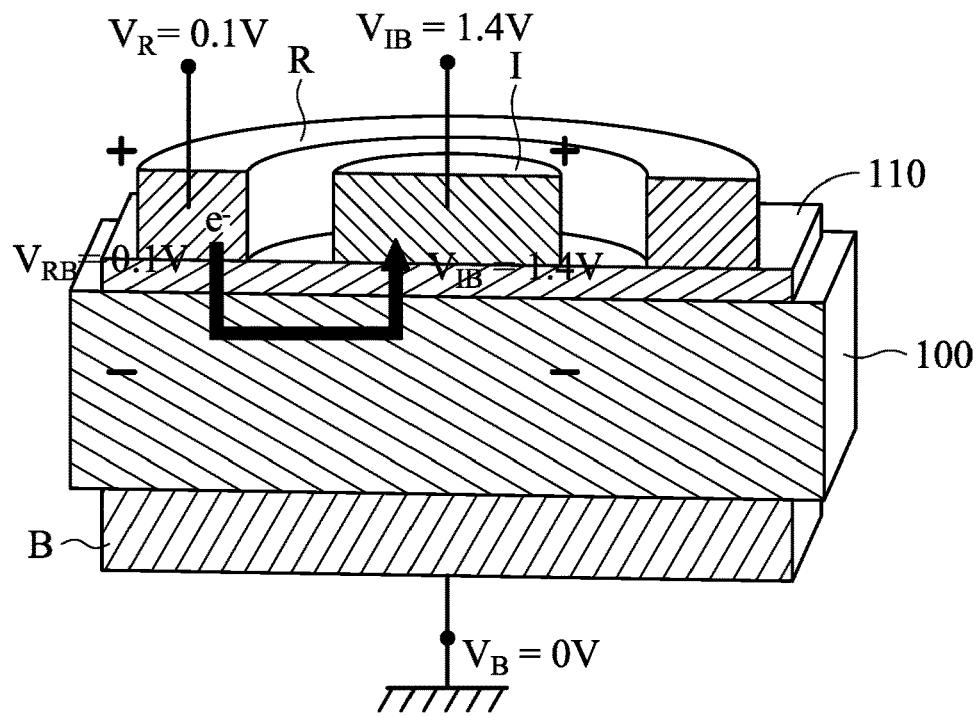
FIG. 13B shows one example of operating the MISIM according to embodiments of the present disclosure, in which $V_I$ (or $V_{IB}$) is 1.4 V.
Figure 13C:
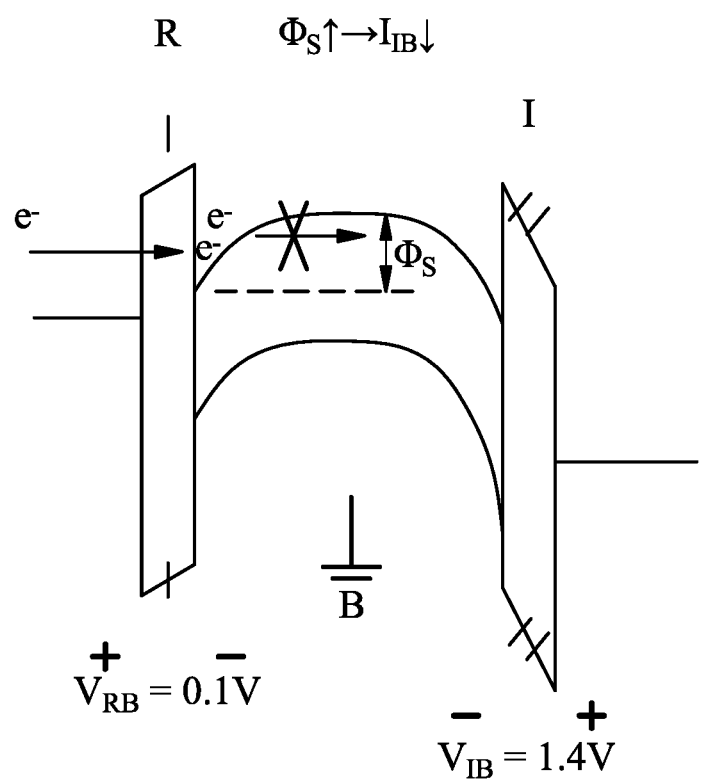
FIG. 13C shows a bandgap diagram of the MISIM according to embodiments of the present disclosure, in which $V_I$ (or $V_{IB}$) is 1.4 V.

FIG. 13A shows the same content as that shown in FIG. 10A, except that an arrow N4 is used in FIG. 13A to represent a fourth trend of the current $I_I$ passing through the first electrode I when $V_I$ (or $V_{IB}$) sweeps from the third predetermined voltage, for example, about 1 V, to a fourth predetermined voltage, for example, about 2 V. FIG. 13B shows one example in which $V_I$ (or $V_{IB}$) is 1.4 V, and FIG. 13C shows a bandgap diagram of the MISIM in which $V_I$ (or $V_{IB}$) is 1.4 V.

Referring to the drawings, in a case in which $V_I$ (or $V_{IB}$) sweeps from about 1 V to about 3 V, due to a relatively large barrier Os, the inversion chargers under the second electrode R are blocked to flow to the first electrode I. Accordingly, when $V_I$ (or $V_{IB}$) increases from about 1 V to about 3 V, the barrier Os increases and $I_I$ decreases. That is, current $I_I$ passing through the first electrode decreases and the MISIM acts as a negative differential resistance, as indicated by the arrow $N_4$.

Figure 14A:
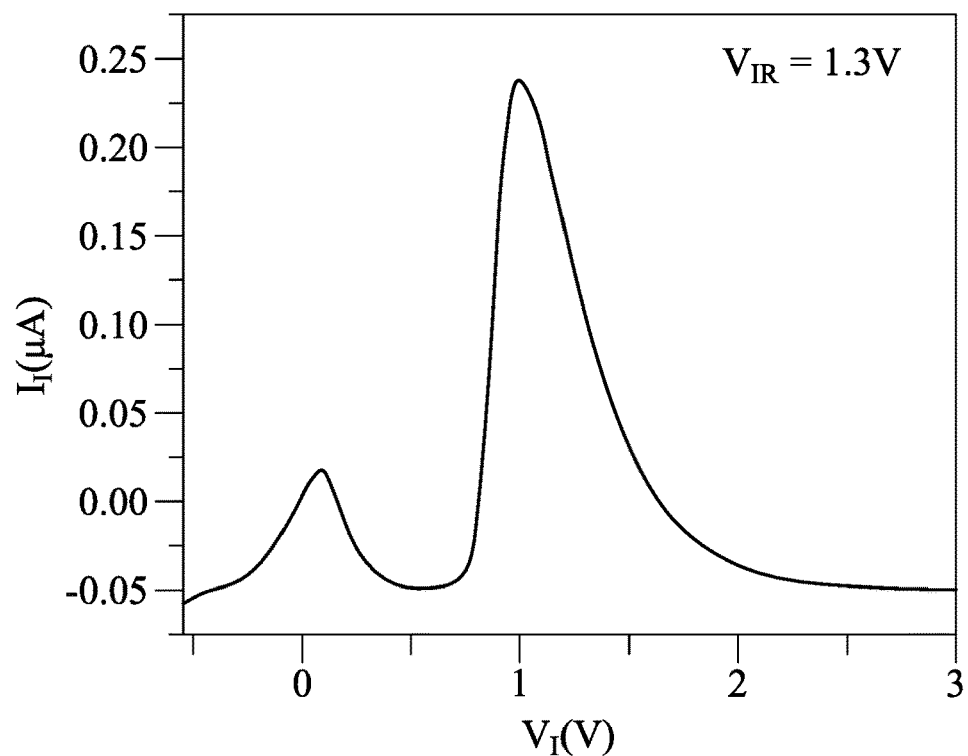
FIG. 14A shows a relation between $I_I$ passing through a first electrode and $V_I$ applied to the first electrode, with a bias $V_{IR}$ applied between the first electrode and a back electrode.

FIG. 14A shows a relation between $I_I$ passing through the first electrode I and $V_I$ applied to the first electrode I (or the bias $V_{IB}$ applied between the first electrode I and the back electrode B), with a bias $V_{IB}$ of 1.3 V applied between the first electrode I and the second electrode R. One of ordinary skill in the art would understand that the curve shown in FIG. 10A, 11A, 12A, or 13A and the curve shown in FIG. 14A are the same as each other except that the lower end of $V_I$ in FIG. 14A is −0.6 V rather than −0.9 V in FIG. 10A, 11A, 12A, or 13A.

Referring to FIG. 14A, $I_I$ passing through the first electrode I has two peaks, in response to $V_I$ applied to the first electrode I sweeping from −0.6 V to 3 V. In this regard, the MISIM operates in a dual NDR mode, as the entire sweeping range from the reference, for example, −0.6 V, to the predetermined voltage, for example, 3 V, $I_I$, as an output signal of the MISIM, has a first peak when $V_I$ is about 0 V and has a second peak when $V_I$ is about 1 V.

Configurations of relative potential applied to the first electrode I, the second electrode R, and the back electrode B of the MISIM according to embodiments of the present disclosure, are not limited to the above example described with reference to FIGS. 10A-14A, such that the MISIM according to embodiments of the present disclosure operates in a dual NDR mode. According to some embodiments, the bias $V_{IR}$ can be adjusted according to design particulars, such that the peak of $I_I$ passing through the first electrode I and the corresponding voltage of $V_I$ can be adjusted.

Figure 14B:
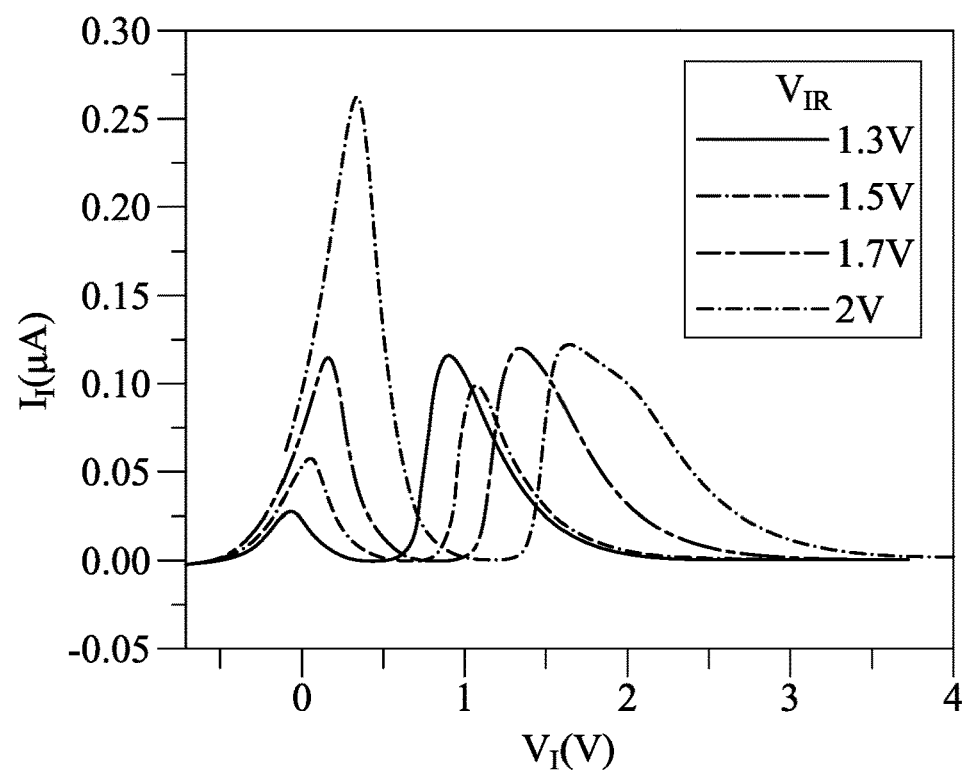
FIG. 14B shows that the MISIM according to embodiments of the present disclosure operates in a dual NDR mode, when $V_{IR}$ of 1.3 V, 1.5 V, 1.7 V, or 2 V is applied.

For example, FIG. 14B shows that, by applying $V_{IR}$ of 1.5 V, 1.7 V, 2V, as well as 1.3 V as described above, the MISIM according to embodiments of the present disclosure operates as a dual NDR with different dual peaks. According to some embodiments, one among the exemplary curves shown in FIG. 14B is selected by selecting the corresponding $V_{IB}$, such that the MISIM operates based on the selected according to design particulars. One of ordinary skill in the art should understand that the curves shown in FIG. 14B are merely examples. In other embodiments, any other value of $V_{IR}$, i.e., a constant value other than the above examples but between a lower limit, for example, 1.5 V and an upper limit, for example, 2 V, is be used.

Figure 14C:
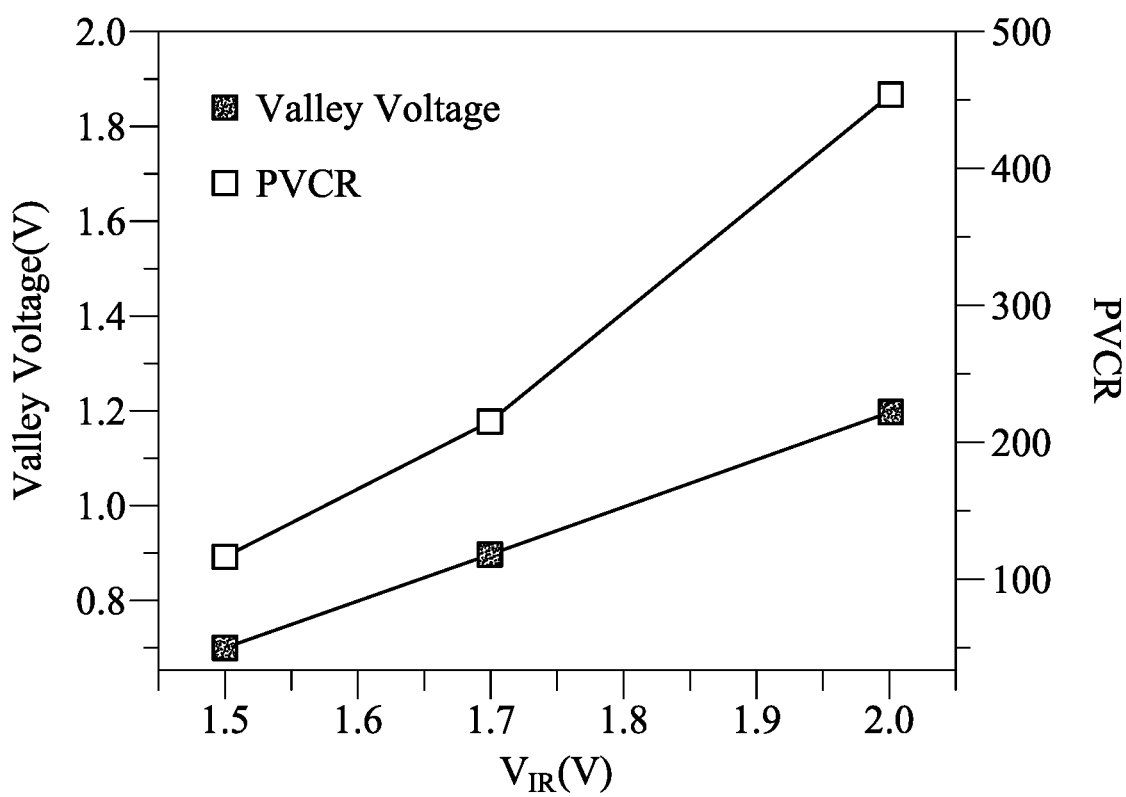
FIG. 14C shows a relation between valley current of $I_I$ passing through a first electrode and a bias $V_{IR}$ applied between the first electrode and a second electrode and a relation between peak-to-valley current ratio (PVCR) of $I_I$ passing through the first electrode and the bias $V_{IR}$ applied between the first electrode and the second electrode.

FIG. 14C shows a relation between valley current of $I_I$ passing through the first electrode I and the bias $V_{IR}$ applied between the first electrode I and the second electrode R and a relation between peak-to-valley current ratio (PVCR) of $I_I$ passing through the first electrode I and the bias $V_{IR}$ applied between the first electrode I and the second electrode R. The values of the valleys shown in FIG. 14C are the values of the valleys of a plurality of curves shown in FIG. 14B. One of ordinary skill in the art would understand that the values of the peak and the valley used to calculate the PVCR are the values of the same curve selected from the plurality of curves shown in FIG. 14B. In some embodiments, the PVCR of $I_I$ passing through the first electrode I can be tuned to be greater than 10.

As described above, the MISIM according to embodiments of the present disclosure acts as a dual NDR device, in response to the above-described relative potential is applied to the terminals such as the first electrode I, the second electrode R, and the back electrode B. In some embodiments, the relative potential applied to the first electrode I and the second electrode R is exchanged, and in this case, $I_R$ passing through the second electrode R is provided as an output signal of the MISIM, similar to $I_I$ described above with reference to FIGS. 9-14C.

Figure 15A:
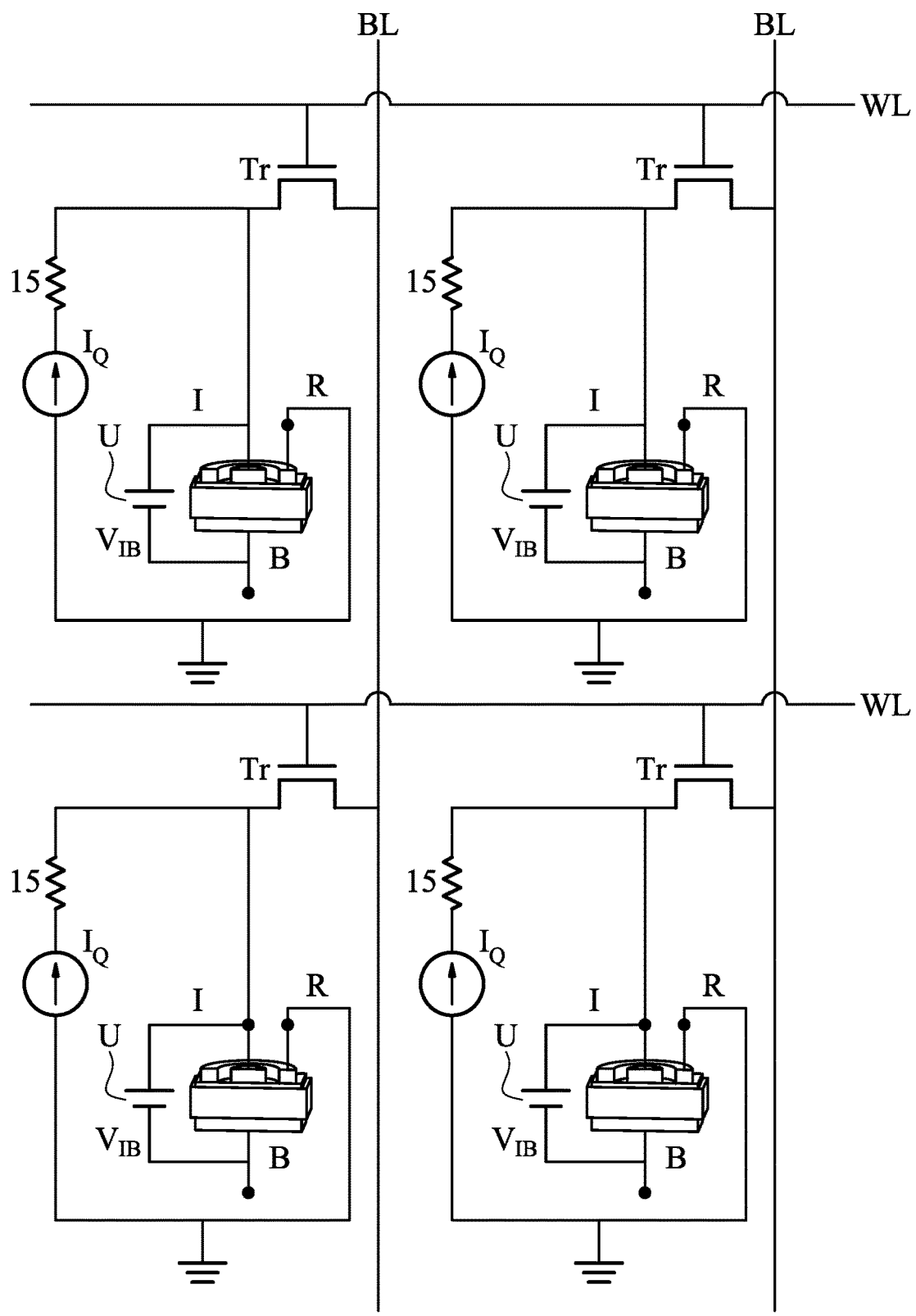
FIG. 15A shows an array of memory cells in which an MISIM is implemented in each memory cell, according to embodiments of the present disclosure.
Figures 15B, 15C:
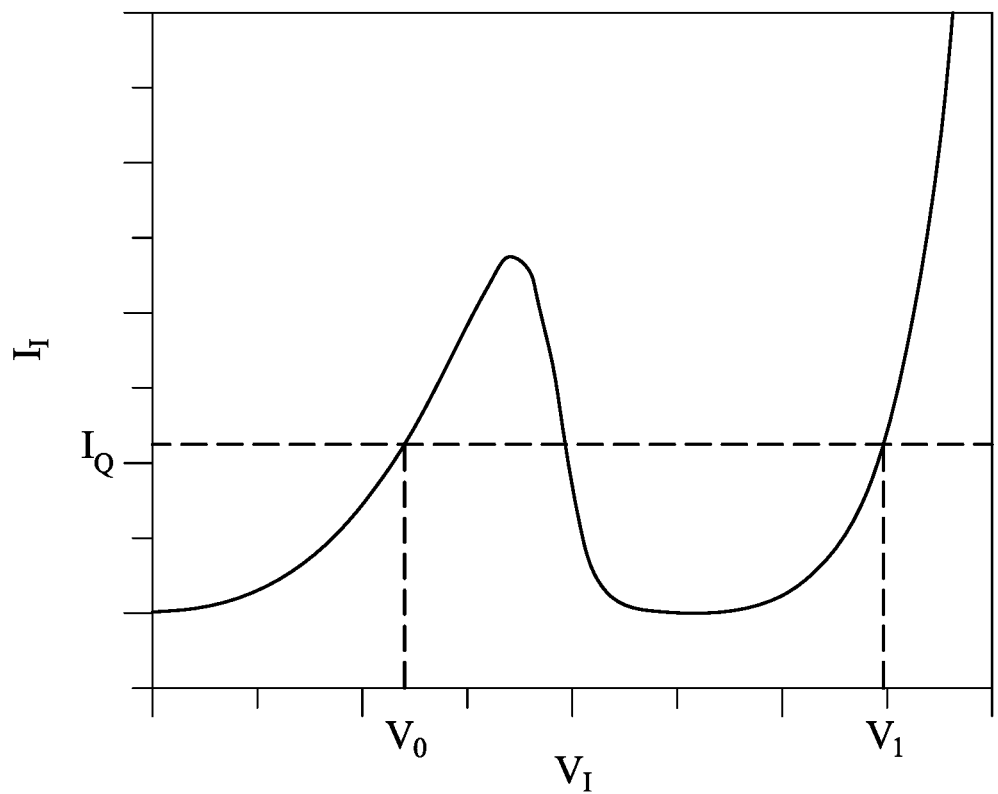
FIG. 15B shows an operation mode of the MISIM implemented in each memory cell.
FIG. 15C shows read/write principle of each memory cell.

FIG. 15A shows an array of memory cells in which an MISIM is implemented in each memory cell according to embodiments of the present disclosure. FIG. 15B shows an operation mode of the MISIM implemented in each memory cell. FIG. 15C shows read/write principle of each memory cell.

Referring to FIG. 15A, each memory cell includes an MISIM, a pass-gate transistor Tr, and a resistor 15, according to some embodiments. In each memory cell, the second electrode R of the MISIM is connected to the ground, a bias voltage source U provides a constant bias $V_{IB}$ i between the first electrode I and the back electrode B of the MISIM, the first electrode I and one terminal of the resistor 15 are connected to a drain of the pass-gate transistor Tr, and a constant current source $I_Q$ connected between the other terminal of the resistor 15 and the ground. Gate electrodes of the pass-gate transistors Tr of the memory cells in the same row are connected to the same wordline WL, and sources of the pass-gate transistors Tr of the memory cells in the same column are connected to the same bitline BL.

The MISIM implemented in each memory cell is connected in manner similar as that shown in FIG. 8A. Accordingly, the MISIM can operate in a single NDR mode, in which two or more values of $V_I$ applied to the first electrode I correspond to one value of $I_I$ passing through the first electrode I, according to some embodiments.

$I_Q$ shown in FIG. 15B is the same as the current provided by the current source $I_Q$ in each memory cell. The same $V_{IB}$ is used to obtain the curve in FIG. 15B and is also used in each memory cell in FIG. 15A. Accordingly, referring to FIGS. 15A-15C, bitline signals $V_0$ and $V_I$, respectively indicative of digital (or binary) "0" and digital (or binary) "1," can be determined based on the IT-VT curve, once the current source $I_Q$ is determined. Thus, in response to a signal $V_{pass}$ applied to the wordline WL, a data signal (i.e., $V_0$ or $V_I$) transmitted by the bitline BL can be stored in a corresponding memory cell in a writing operation or a signal, represented by a voltage $V_0$ or $V_I$ stored in a corresponding memory cell, can be transmitted to the bitline BL in a reading operation.

Figure 16A:
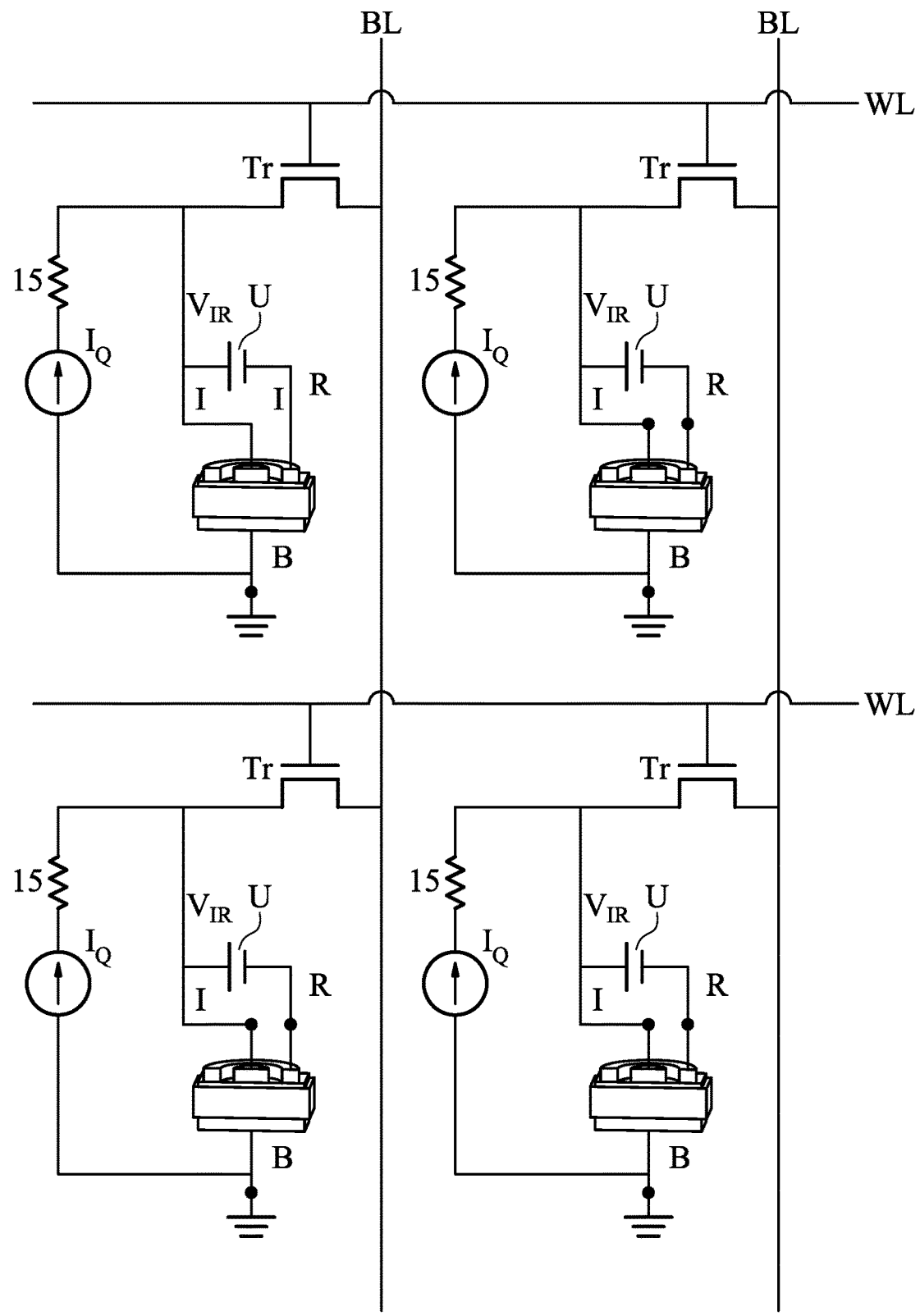
FIG. 16A shows an array of memory cells in which an MISIM, operating in a dual NDR mode, is implemented in each memory cell, according to embodiments of the present disclosure.
Figures 16B, 16C:
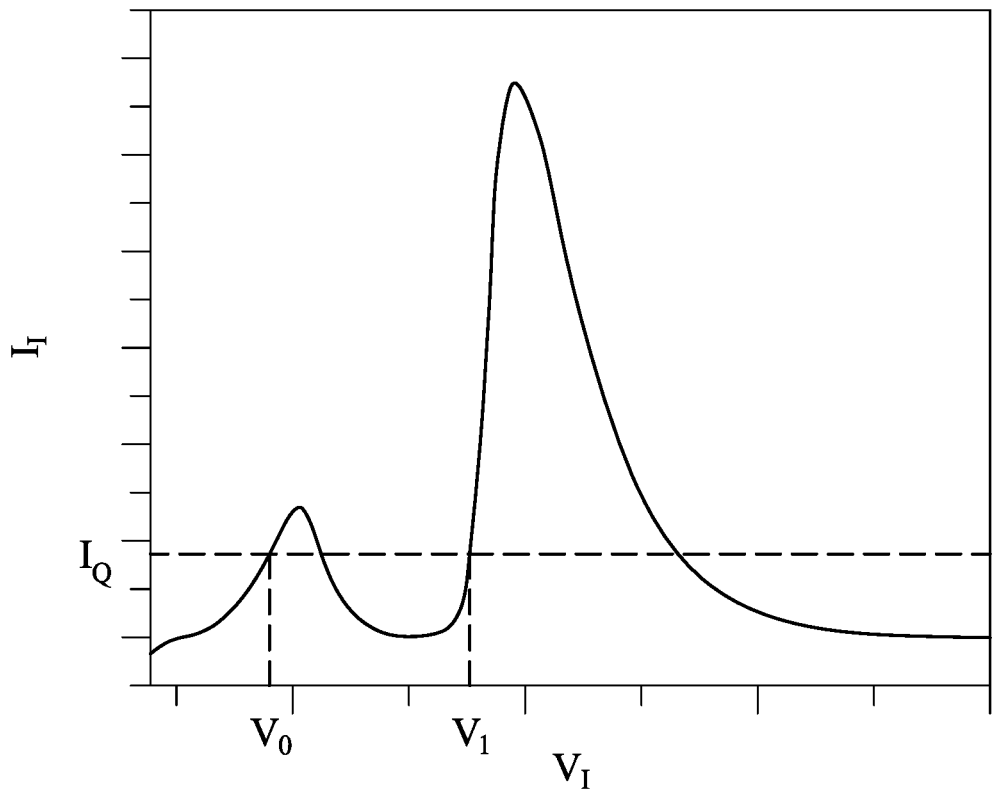
FIG. 16B shows an operation mode of the MISIM implemented in each memory cell.
FIG. 16C shows an operation principle of each memory cell.

According to some embodiments, the MISIM of the present disclosure, if operating in a dual NDR mode, is also implemented to a memory cell. FIG. 16A shows an array of memory cells in which an MISIM, operating in a dual NDR mode, is implemented in each memory cell according to embodiments of the present disclosure. FIG. 16B shows an operation mode of the MISIM implemented in each memory cell. FIG. 16C shows an operation principle of each memory cell.

Referring to FIG. 16A, each memory cell includes an MISIM, a pass-gate transistor Tr, and a resistor 15, according to some embodiments. In each memory cell, the back electrode B of the MISIM is connected to the ground, a bias voltage source U provides a constant bias $V_{IR}$ between the first electrode I and the second electrode R of the MISIM, the first electrode I and one terminal of the resistor 15 are connected to a drain of the pass-gate transistor Tr, and a constant current source $I_Q$ is connected between the other terminal of the resistor 15 and the ground. Gate electrodes of the pass-gate transistors Tr of the memory cells in the same row are connected to the same wordline WL, and sources of the pass-gate transistors Tr of the memory cells in the same column are connected to the same bitline BL.

The MISIM implemented in each memory cell is connected in manner similar as that shown in FIG. 9. Accordingly, the MISIM can operate in a dual NDR mode, in which two or more values of $V_I$ applied to the first electrode I correspond to one value of $I_I$ passing through the first electrode I, according to some embodiments.

$I_Q$ shown in FIG. 16B is the same as the current provided by the current source $I_Q$ in each memory cell shown in FIG. 16A. The same $V_{IB}$ is used to obtain the curve in FIG. 16B and is also used in each memory cell in FIG. 16A. Accordingly, referring to FIGS. 16A-16C, bitline signals $V_0$ and $V_I$, respectively indicative of digital (or binary) "0" and digital (or binary) "1," can be determined based on the curve, once the current source $I_Q$ is determined. Thus, in response to a signal $V_{pass}$ applied to the wordline WL, a data signal (i.e., $V_0$ or $V_I$) transmitted by the bitline BL can be stored in a corresponding memory cell in a writing operation, or a data signal, represented by a voltage $V_0$ or $V_I$ stored in a corresponding memory cell, can be transmitted to the bitline BL in a reading operation.

As described above, an MISIM operating in either a single NDR mode or a dual NDR mode can be implemented in a memory cell which stores one state, digital (or binary) "1" corresponding to logic high or digital (or binary) "0" corresponding to logic low. The present disclosure is not limited thereto. In some embodiments to be described below with reference to FIGS. 17A-20D, the MISIM is implemented in a memory cell to store one or more states.

Figure 17A:
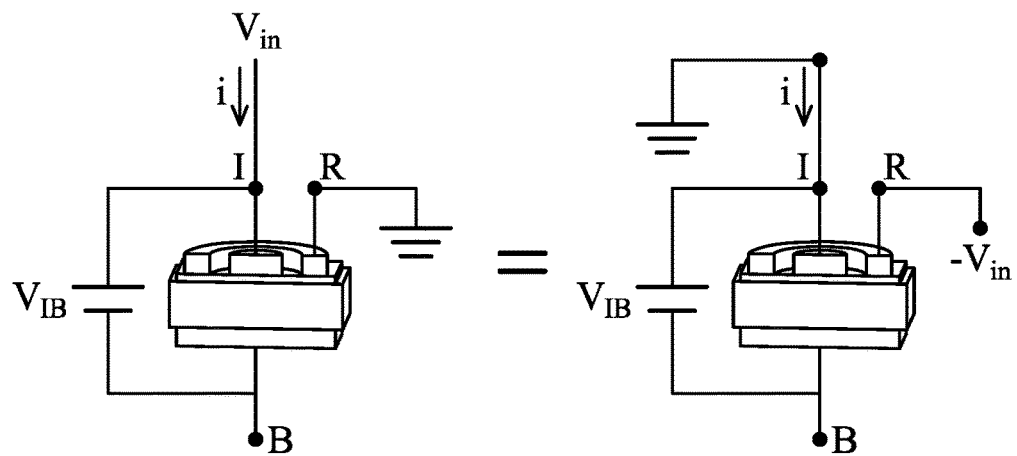
FIG. 17A shows equivalent connections of an MISIM according to embodiments of the present disclosure.
Figure 17B:
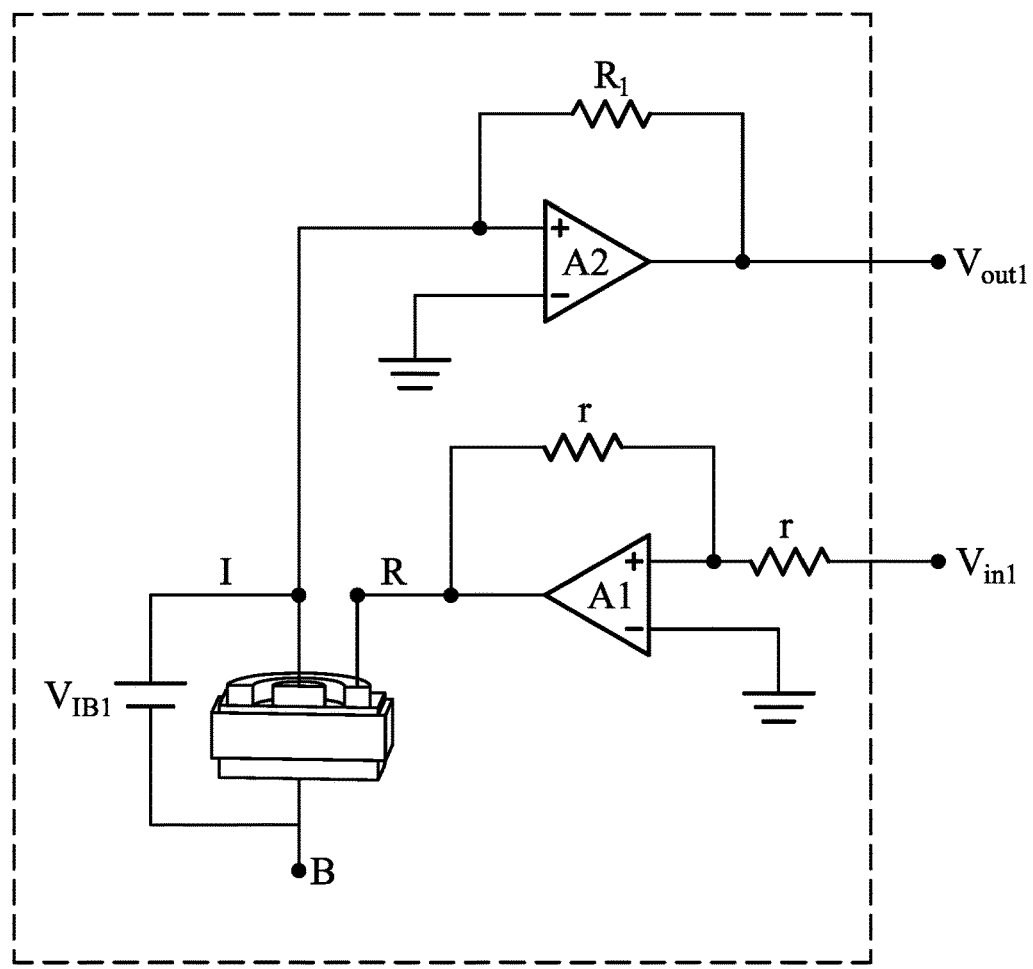
FIG. 17B shows a circuit diagram including the MISIM according to embodiments of the present disclosure.
Figure 17C:
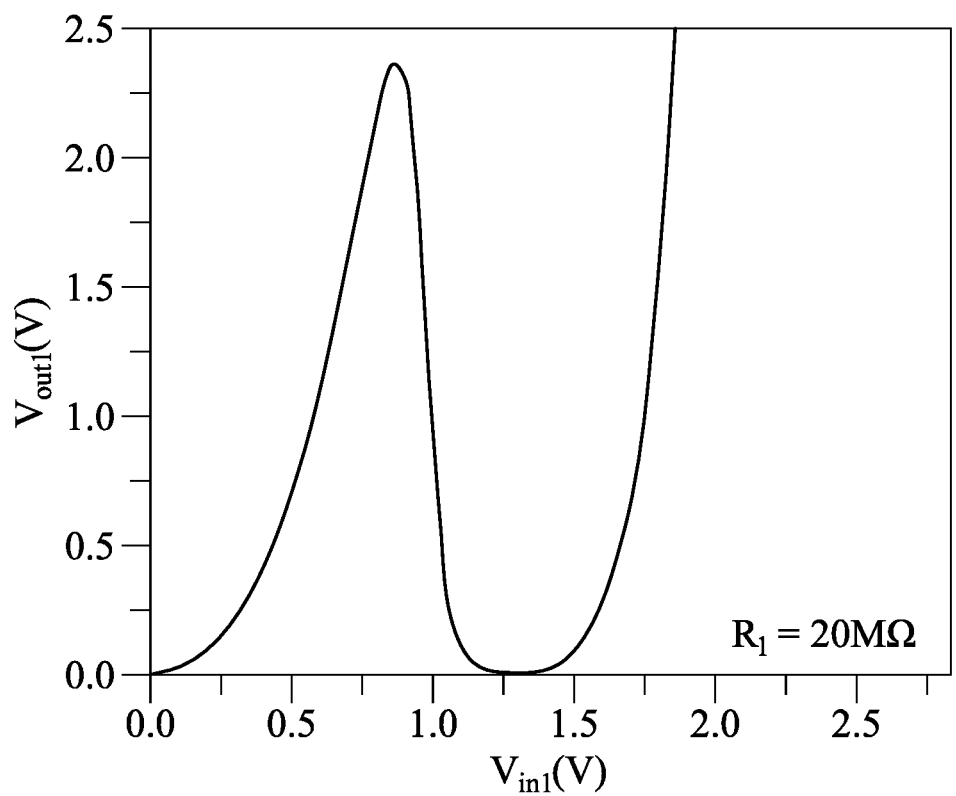
FIG. 17C shows a relation between an input signal and an output signal of the circuit diagram shown in FIG. 17B.

FIG. 17A shows equivalent connections of an MISIM according to embodiments of the present disclosure. FIG. 17B shows a circuit diagram including the MISIM according to embodiments of the present disclosure. FIG. 17C shows a relation between an input signal and an output signal of the circuit diagram shown in FIG. 17B.

Referring to a connection of the MISIM on the left side of FIG. 17A, the second electrode R is connected to the ground, a bias voltage source U provides a constant bias $V_{IB}$ i between the first electrode I and the back electrode B, and an input voltage $V_{in}$ is applied to the first electrode I.

Referring to a connection of the MISIM on the right side of FIG. 17A, the constant bias $V_{IB}$ is applied between the first electrode I and the back electrode B, and the voltage applied to the second electrode R and the input voltage applied to the first electrode I are both lowered by $V_{in}$, with reference to those shown in the left side of FIG. 17A. Since relative potential applied in the terminals of the MISIM including the first electrode I, the second electrode R, and the back electrode B are the same in the two configurations shown in FIG. 17A, the two configurations thereof are equivalent to each other.

Referring to FIG. 17B, in the circuit diagram, the second electrode R of the MISIM is connected to an input terminal $V_{in1}$ and the first electrode I of the MISIM is connected to an output terminal $V_{out1}$. In some embodiments, an input signal having a positive voltage applied to the input terminal $V_{in1}$ is converted to a negative voltage having the same absolute value as the positive negative voltage and applied to the second electrode R, by a first amplifier A1 and series connected resistors r having the same resistance (e.g., from 1Ω to 100 MΩ) connected to the first amplifier A1 and between the input terminal $V_{in1}$ and the second electrode R. In some embodiments, current, as an output of the first electrode I, passing through the first electrode I is converted to a signal having a voltage format output at the output terminal $V_{out1}$ by a second amplifier A2 and a resistor $R_1$. Thus, both the input signal and the output signal as shown in FIG. 17C have a voltage format. According to some embodiments, in a case in which the resistor $R_1$ is selected to have a suitable resistance value, the output signal has suitable amplitude. For example, in a case in which the MISIM having characteristics shown in FIG. 8B and in a case in which $R_1$ is equal to 20 MΩ, the peak of the output signal is about 2.4 V, suitable to be a signal to be transmitted in a bitline in a memory device. One of ordinary skill in the art would understand that $R_1$ having a resistance of 20 MΩ is merely an example and the resistance value of $R_1$ is not limited thereto. In other embodiments, the resistance value of $R_1$ can be adjusted according the characteristics of the MISIM, such that a suitable range of the output signal can be obtained. In some embodiments, the resistance value of $R_1$ is from 1 MΩ to 100 MΩ.

Figure 18A:
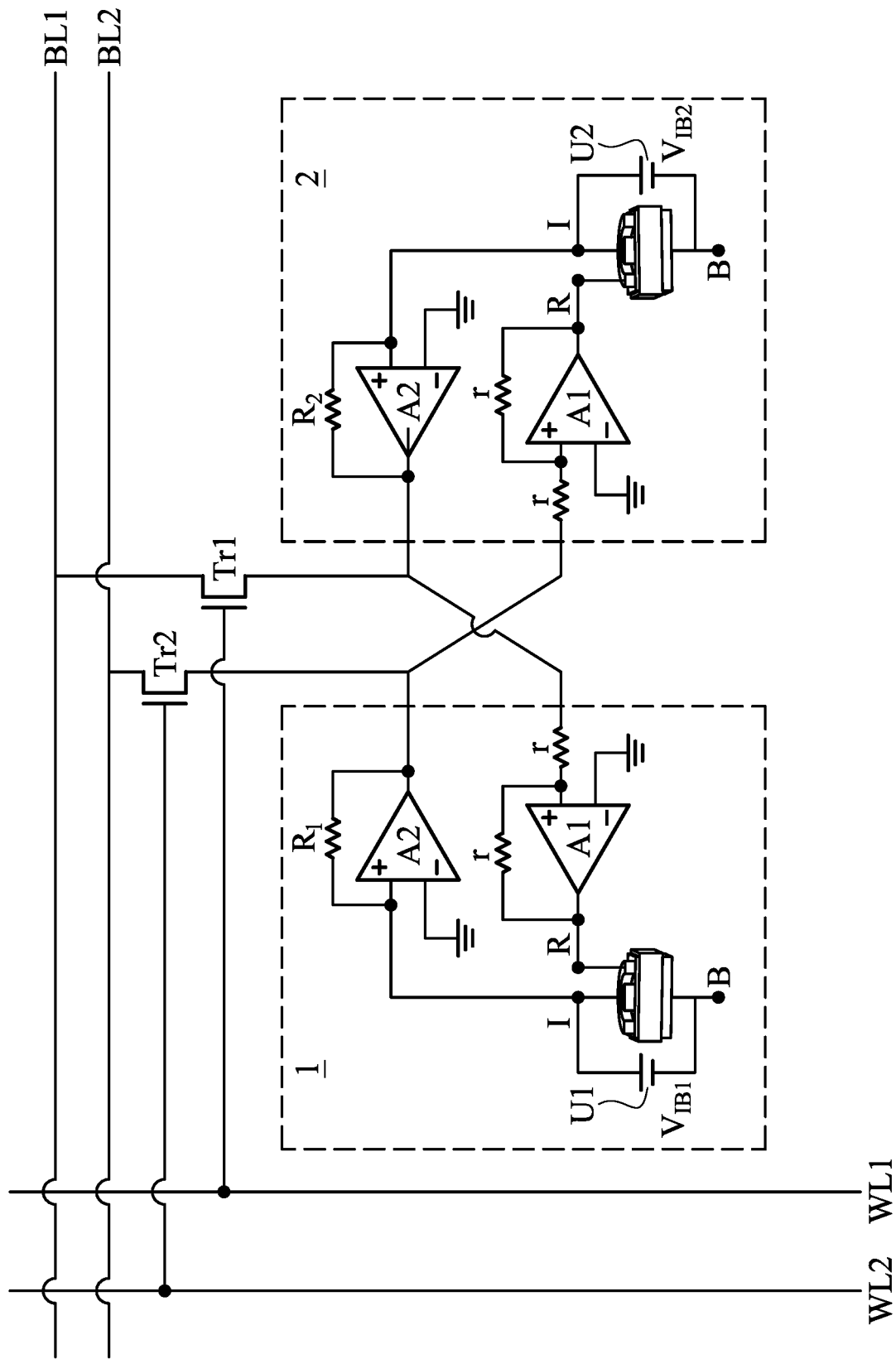
FIG. 18A shows a schematic view of cross-coupled memory cells, in which the structure shown in FIG. 17B is implemented in each memory cell.
Figure 18B:
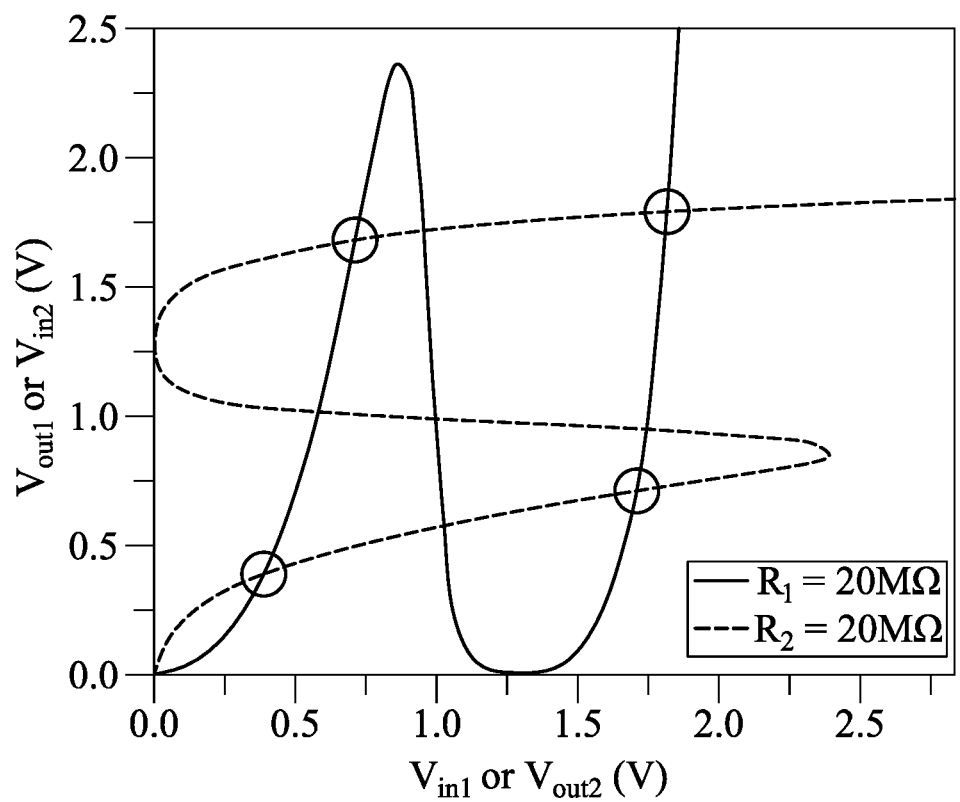
FIG. 18B shows an operation mode of the cross-coupled memory cells shown in FIG. 18A.
Figures 18C, 18D:
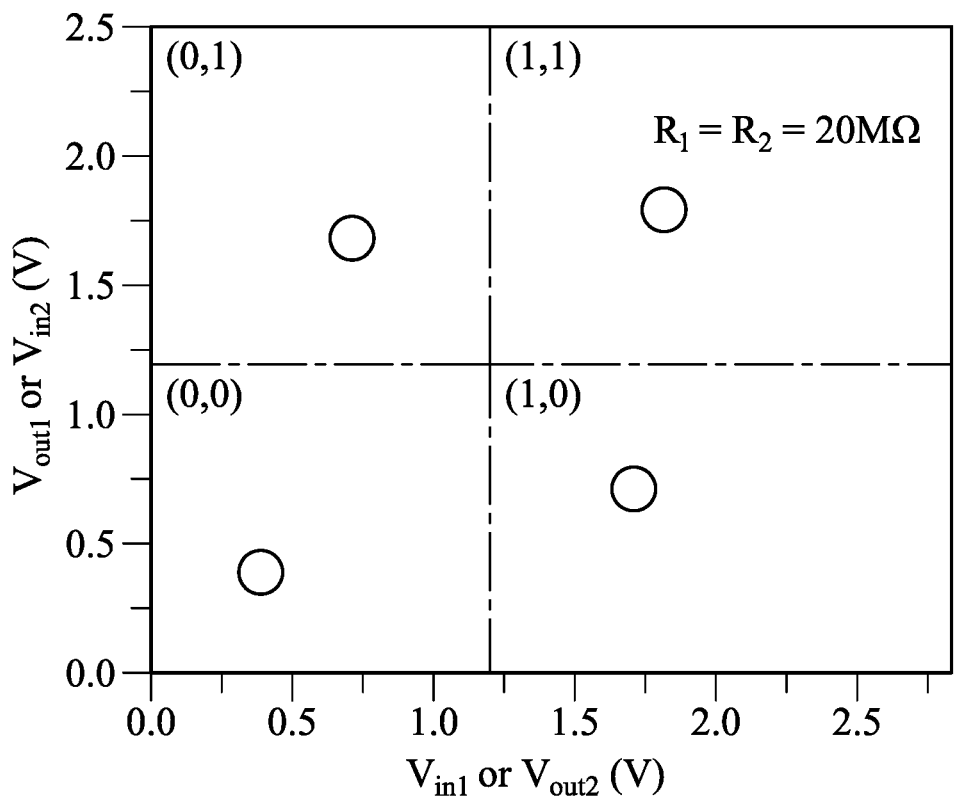
FIG. 18C shows states of the cross-coupled memory cells shown in FIG. 18A.
FIG. 18D shows ranges of input signal and output signal of the cross-coupled memory cells suitable to represent digital (or binary) data "00," "01," "10," and "11."

FIG. 18A shows a schematic view of cross-coupled memory cells, in which the structure shown in FIG. 17B is implemented in each memory cell. FIG. 18B shows an operation mode of the cross-coupled memory cells shown in FIG. 18A. FIG. 18C shows states of the cross-coupled memory cells shown in FIG. 18A. FIG. 18D shows ranges of input signal and output signal of the cross-coupled memory cells suitable to represent digital (or binary) data "00," "01," "10," and "11."

Referring to FIG. 18A, the cross-coupled memory cells including a first memory cell 1 and a second memory cell 2. An input terminal of the second memory cell 2 is coupled to an output terminal of the first memory cell 1, and an output terminal of the second memory cell 2 is coupled to an input terminal of the first memory cell 1. In some embodiments, each of the first memory cell 1 and the second memory cell 2 can be the same as the structure shown in FIG. 17B, although the present disclosure is not limited thereto.

Still referring to FIG. 18A, a first bitline BL1 is connected to the input terminal of the first memory cell 1 (or the output terminal of the second memory cell 2) through a first pass-gate transistor Tr1, and a second bitline BL2 is connected to the input terminal of the second memory cell 2 (or the input terminal of the first memory cell 1) through a second pass-gate transistor Tr2. A first wordline WL1 is connected to a gate electrode of the first pass-gate transistor Tr1, and a second wordline WL2 is connected to a gate electrode of the second pass-gate transistor Tr2.

In a case in which each of the first memory cell 1 and the second memory cell 2 is the same as the structure shown in FIG. 17B, a relation between an input signal and an output signal of each of the first memory cell 1 and the second memory cell 2 is the same as those shown in FIG. 17C. FIG. 18B shows a relation between an input signal $V_{in1}$ and an output signal $V_{out1}$ of the first memory cell 1 and a relation of an input signal $V_{in2}$ and an output signal $V_{out2}$ of the first memory cell 1. Since the first memory cell 1 and the second memory cell 2 are cross-coupled, the input signal $V_{in1}$ of the first memory cell 1 is the same as the output signal $V_{out2}$ of the second memory cell 2, and the output signal $V_{out1}$ of the first memory cell 1 is the same as the input signal $V_{in2}$ of the second memory cell 2, as shown in FIG. 18B. Since the MISIM operates in a single NDR mode having one peak and the resistor R2 is selected to be a large enough value, for example, 20 MΩ, the peak of the output signal $V_{out1}$ of the first memory cell 1 (or the peak of the output signal $V_{out2}$ of the second memory cell 2) is greater than the corresponding input signal $V_{in1}$ of the first memory cell 1 (or the corresponding input signal $V_{in2}$ of the second memory cell 2). Accordingly, the two curves, $V_{out1}$-$V_{in1}$ and $V_{out2}$-$V_{in1}$ cross each other at four or more points (represented by circles in FIG. 18B).

According to some embodiments, based on the four points at which the two curves, $V_{out1}$-$V_{in1}$ and $V_{out2}$-$V_{in1}$ cross with each other shown in FIG. 18B, digital (or binary) data "00," "01," "10," and "11" stored in or read from the cross-coupled first and second memory cells 1 and 2 are defined, for example, by boundaries represented by dash lines in FIG. 18C. The locations of the boundaries to define digital (or binary) data "00," "01," "10," and "11" should not limited to those shown in FIG. 18C and can be modified, as long as the four points represented by circles in FIG. 18C are in different quadrants of a coordinate system defined by the boundaries.

FIG. 18D shows an example defining digital (or binary) data "00," "01," "10," and "11" of the cross-coupled first and second memory cells 1 and 2 shown in FIG. 18A, in a case in which the characteristics of each of the first and second memory cells 1 and 2 satisfy the relation shown in FIG. 18B. The ranges of the input signals or the out signals $V_{in1}$ $V_{out2}$, $V_{in2}$, and $V_{out2}$ shown in FIG. 18D defining digital (or binary) data "00," "01," "10," and "11" are merely an example. The present disclosure is not limited thereto.

Figure 19A:
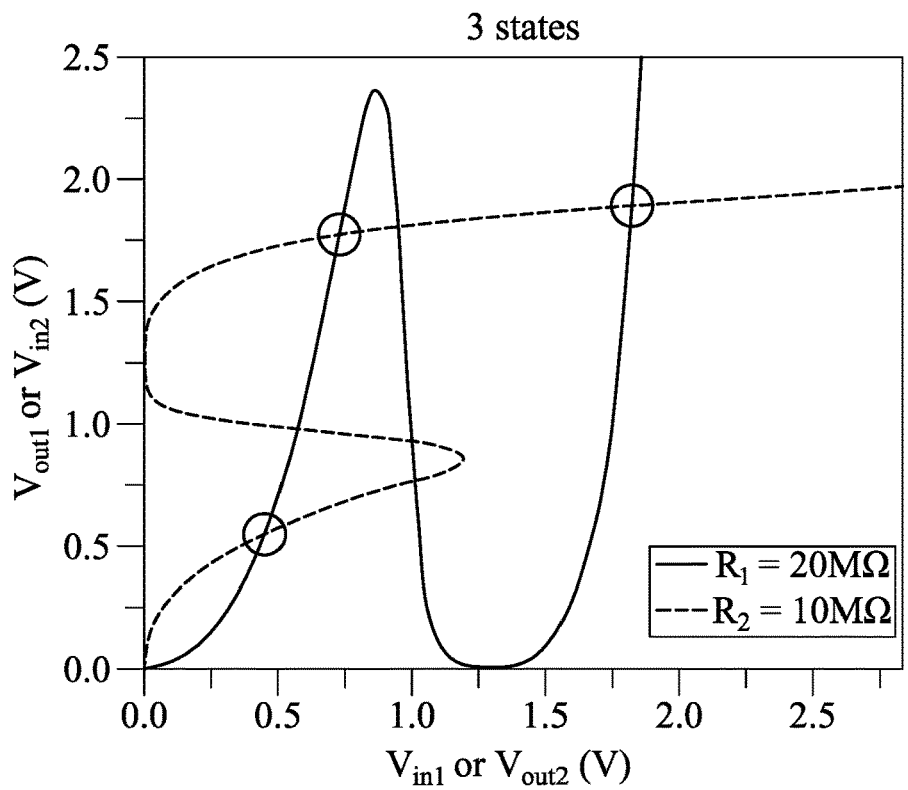
FIG. 19A shows an operation mode of the cross-coupled memory cells shown in FIG. 18A, in which the cross-coupled memory cells have three states.
Figure 19B:
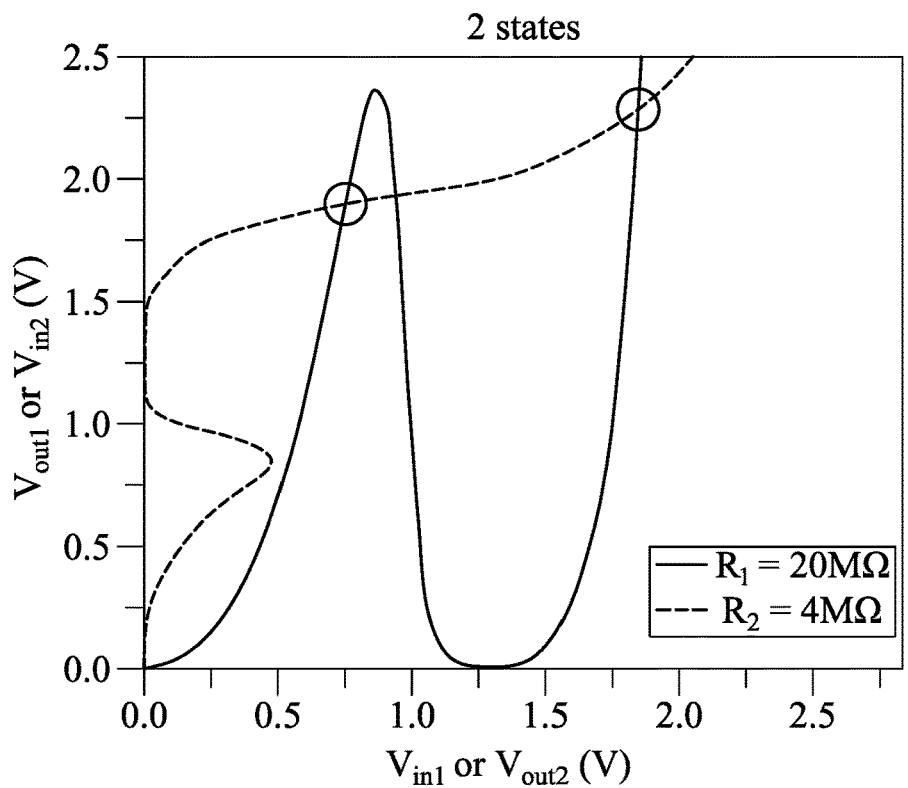
FIG. 19B shows an operation mode of the cross-coupled memory cells shown in FIG. 18A, in which the cross-coupled memory cells have two states.
Figure 19C:
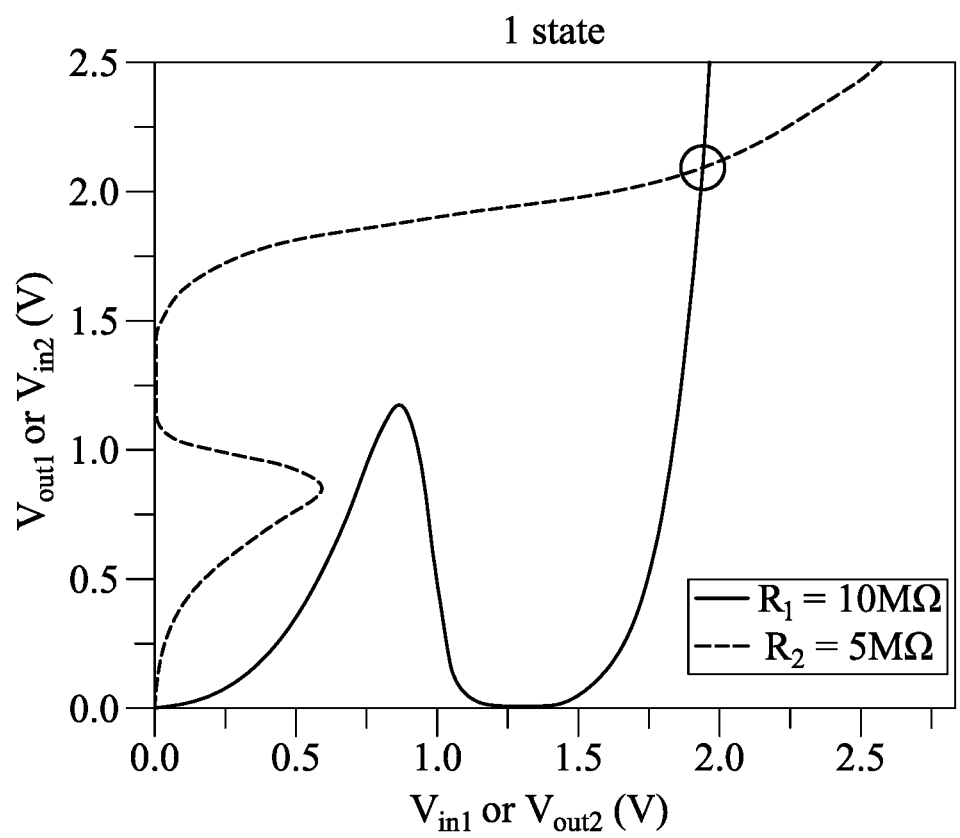
FIG. 19C shows an operation mode of the cross-coupled memory cells shown in FIG. 18A, in which the cross-coupled memory cells have one state.

FIG. 19A shows an operation mode of the cross-coupled memory cells shown in FIG. 18A, in which the cross-coupled memory cells have three states. FIG. 19B shows an operation mode of the cross-coupled memory cells shown in FIG. 18A, in which the cross-coupled memory cells have two states. FIG. 19C shows an operation mode of the cross-coupled memory cells shown in FIG. 18A, in which the cross-coupled memory cells have one state.

According to some embodiments, by selecting suitable resistance values of the first resistor $R_1$ and the second resistor $R_2$ of the cross-coupled memory cells shown in FIG. 18A, the two curves, $V_{out1}$-$V_{in1}$ and $V_{out2}$-$V_{in2}$, of the cross-coupled memory cells can have four states (denoted by circles) as shown in FIG. 18B as described above, in a case in which $R_1$ is 20 MΩ and $R_2$ is 20 M.

According to some embodiments, by selecting suitable resistance values of the first resistor $R_1$ and the second resistor $R_2$ of the cross-coupled memory cells shown in FIG. 18A, the two curves, $V_{out1}$-$V_{in1}$ and $V_{out2}$-$V_{in2}$, of the cross-coupled memory cells have three states (denoted by circles) as shown in FIG. 19A, in a case in which $R_1$ is 20 MΩ and $R_2$ is 10 MΩ or vice versa.

According to some embodiments, by selecting suitable resistance values of the first resistor $R_1$ and the second resistor $R_2$ of the cross-coupled memory cells shown in FIG. 18A, the two curves, $V_{out1}$-$V_{in1}$ and $V_{out2}$-$V_{in2}$, of the cross-coupled memory cells have two states (denoted by circles) as shown in FIG. 19B, in a case in which $R_1$ is 20 MΩ and $R_2$ is 4 MΩ or vice versa.

According to some embodiments, by selecting suitable resistance values of the first resistor $R_1$ and the second resistor $R_2$ of the cross-coupled memory cells shown in FIG. 18A, the two curves, $V_{out1}$-$V_{in1}$ and $V_{out2}$-$V_{in2}$, of the cross-coupled memory cells have one state (denoted by circle) as shown in FIG. 19C, in a case in which $R_1$ is 10 MΩ and $R_2$ is 5 MΩ or vice versa.

That is, the cross-coupled memory cells shown in FIG. 18A can be implemented to store one among one to four states, in accordance with suitable resistance values of the first resistor $R_1$ and the second resistor $R_2$. The exemplary resistance values of the first resistor $R_1$ and the second resistor $R_2$ described above are merely examples, and the present disclosure is not limited thereto.

In the above descriptions with reference to FIGS. 18B-19C to obtain multistate of the cross-coupled memory cells shown in FIG. 18A, the bias V is applied in each memory cell is maintained constantly at 0.5 V and the resistance values of the first resistor $R_1$ and the second resistor $R_2$ are adjusted according to design particulars. The present disclosure, however, is not limited thereto. In some embodiments, the resistance value of the first resistor $R_1$ and the resistance value of the second resistor $R_2$ are from 1 MΩ to 100 MΩ.

Figure 20A:
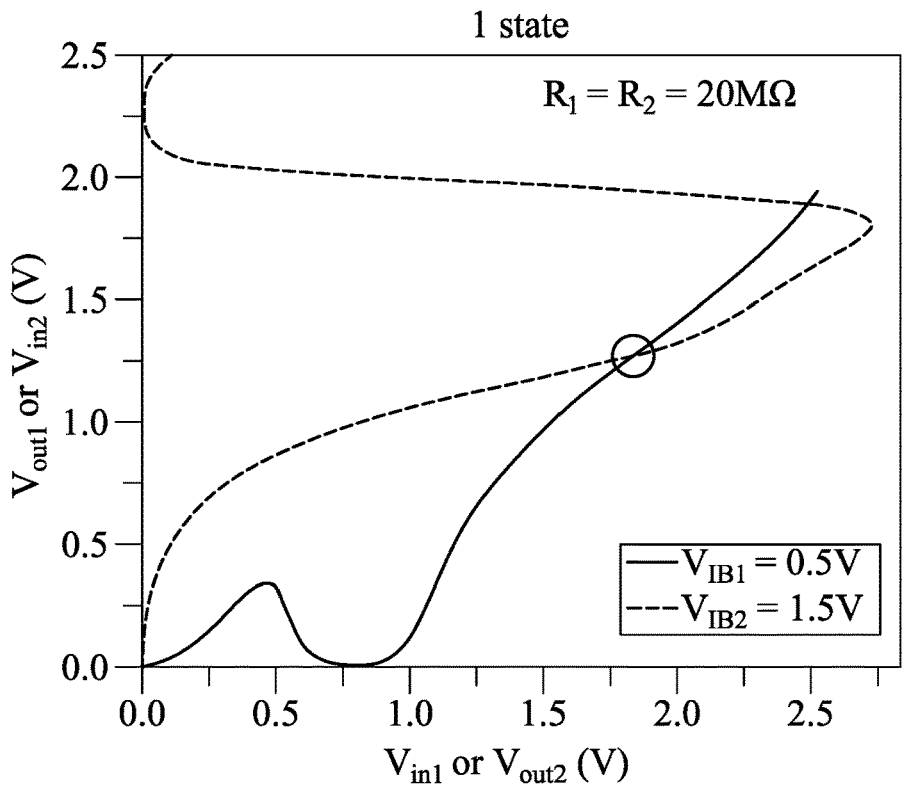
FIG. 20A shows an operation mode of the cross-coupled memory cells shown in FIG. 18A, in which the cross-coupled memory cells have one state.
Figure 20B:
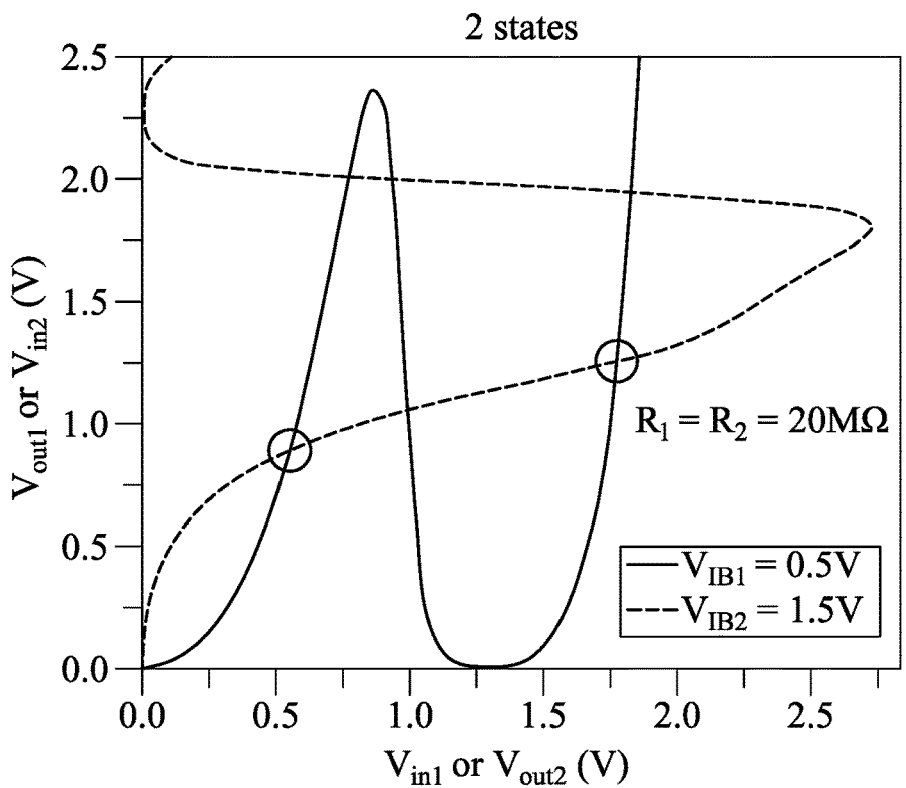
FIG. 20B shows an operation mode of the cross-coupled memory cells shown in FIG. 18A, in which the cross-coupled memory cells have two states.
Figure 20C:
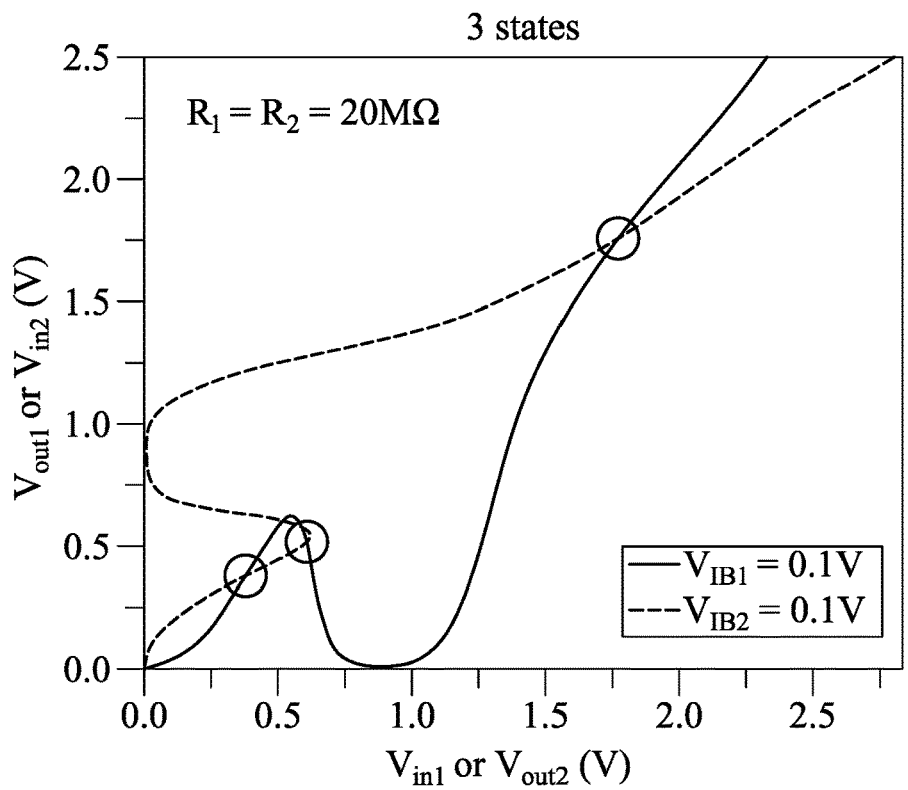
FIG. 20C shows an operation mode of the cross-coupled memory cells shown in FIG. 18A, in which the cross-coupled memory cells have three states.
Figure 20D:
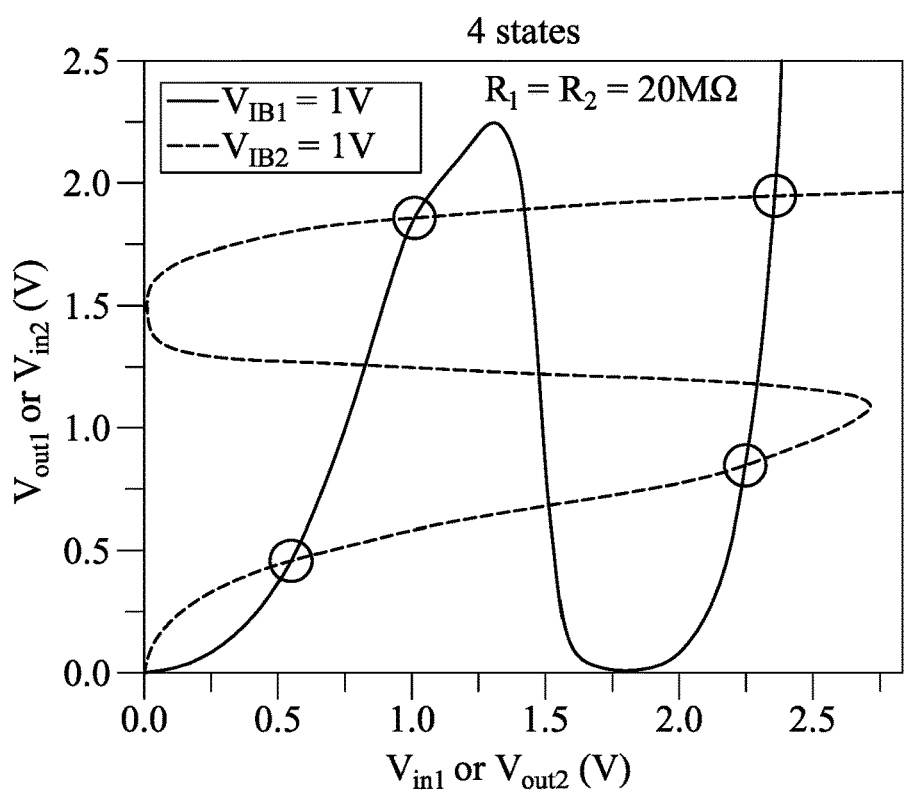
FIG. 20D shows an operation mode of the cross-coupled memory cells shown in FIG. 18A, in which the cross-coupled memory cells have four states.

According to other embodiments, multistates of the cross-coupled memory cells shown in FIG. 18A can be achieved by selecting a suitable bias $V_{IB}$ while maintaining the constant resistance values of the first resistor $R_1$ and the second resistor $R_2$. FIG. 20A shows an operation mode of the cross-coupled memory cells shown in FIG. 18A, in which the cross-coupled memory cells have one state. FIG. 20B shows an operation mode of the cross-coupled memory cells shown in FIG. 18A, in which the cross-coupled memory cells have two states. FIG. 20C shows an operation mode of the cross-coupled memory cells shown in FIG. 18A, in which the cross-coupled memory cells have three states. FIG. 20D shows an operation mode of the cross-coupled memory cells shown in FIG. 18A, in which the cross-coupled memory cells have four states.

Referring to FIGS. 20A-20C, each of the resistance values of the first resistor $R_1$ and the second resistor $R_2$ is constantly 20 MΩ and on the other hand, $V_{IB1}$, a bias generated by a bias voltage source U1 and applied between the first electrode I and the back electrode B of the first memory cell 1 in FIG. 18A, and $V_{IB2}$, a bias generated by a bias voltage source U2 and applied between the first electrode I and the back electrode B of the second memory cell 2 in FIG. 18A, are adjusted accordingly. For example, in a case in which $V_{IB1}$ is 0 V, and $V_{IB1}$ is 1.5 V, the cross-coupled memory cells have one state (denoted by circle) as shown in FIG. 20A. For example, in a case in which $V_{IB1}$ is 0.5 V, and $V_{IB1}$ is 1.5 V, the cross-coupled memory cells have two states (denoted by circles) as shown in FIG. 20B. For example, in a case in which $V_{IB1}$ is 0.1 V, and $V_{IB1}$ is 0.1 V, the cross-coupled memory cells have three states (denoted by circles) as shown in FIG. 20C. For example, in a case in which $V_{IB1}$ is 1 V, and $V_{IB1}$ is 1 V, the cross-coupled memory cells have four states (denoted by circles) as shown in FIG. 20D. The exemplary resistance values of the first resistor $R_1$ and the second resistor $R_2$ and exemplary values $V_{IB1}$ and $V_{IB2}$ described above to obtain multistates of the cross-coupled memory cells shown in FIG. 18A are merely examples, and the present disclosure is not limited thereto.

Although described above, the sweeping voltage applied between the first electrode I and the second electrode R or applied between the first electrode I and the back electrode B gradually increases from a reference voltage to a predetermined voltage. The present disclosure, however, is not limited thereto. According to some embodiments, the sweeping voltage applied between the first electrode I and the second electrode R or applied between the first electrode I and the back electrode B gradually decreases from the predetermined voltage to the reference voltage.

Figure 21:
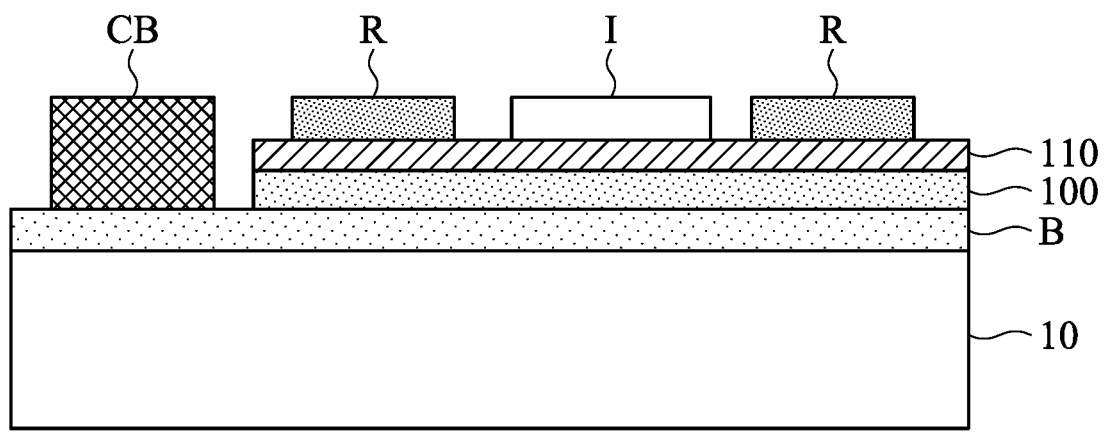
FIG. 21 shows a cross-sectional view of an MISIM according to embodiments of the present disclosure.

FIG. 21 shows a cross-sectional view of a metal-insulator-semiconductor-insulator-metal (MISIM) according to embodiments of the present disclosure. Referring to FIG. 21, the MISIM is formed on a substrate 10 which can be a semiconductor substrate, an insulating substrate, or any suitable substrate. The MISIM according to embodiments of the present disclosure includes a back electrode B disposed on the substrate 10, a semiconductor layer 100 disposed on the back electrode B, an insulating layer 110 disposed on the semiconductor layer 100, a first electrode I and a second electrode R disposed on the insulating layer 110 and spaced-apart from each other, and a contact CB, made of an electrically conductive material, electrically connected to the back electrode B and formed in a region in which the semiconductor layer 100 and the insulating layer 110 are removed. The structure of the MISIM shown in FIG. 21 is substantially the same as that shown in FIGS. 1 and 2, except that the MISIM shown in FIG. 21 includes the substrate 10 and the contact CB. Materials for forming various layers of the MISIM shown in FIG. 21 can refer to those described above, and thus, descriptions thereof will be omitted to avoid redundancy.

According to some aspects, NDR characteristics of an MISIM device can be obtained by simultaneously sweeping a voltage between two of three terminals of the MISIM device while maintaining a bias between another two of three terminals of the MISIM device. Accordingly, an output of the MISIM device, i.e., current passing through one of the three terminals of the MISIM device can be controlled by the lateral minority carriers supplied from another of the three terminals of the MISIM device such that the current can be exponentially amplified by Schottky barrier height. In some embodiments, the minority carriers are determined by competition of electron injection, inversion charge, and the energy barrier for electrons flowing from one of the three terminals of the MISIM device, thereby increasing design freedom to control the output current based on the sweeping voltage and the bias.

According to some aspects, the MISIM device operates in a single NDR mode or a dual NDR mode, by changing a control circuit of the MISIM device but without changing the structure of the MISIM device.

According to some aspects, the MISIM device includes three terminals, one semiconductor layer, and an insulating layer. As such, the manufacturing process to make the MISIM is CMOS compatible, allowing the MISIM device to be, for example, a memory device manufactured by CMOS process.

In one embodiment, a metal-insulator-semiconductor-insulator-metal (MISIM) device includes a semiconductor layer, an insulating layer disposed over an upper surface of the semiconductor layer, a back electrode disposed over a lower surface of the semiconductor layer opposing the upper surface, and first and second electrodes disposed over the insulating layer and spaced-apart from each other. In one embodiment, the first electrode has a circular shape and the second electrode has a ring shape surrounding the first electrode. In one embodiment, the first electrode and the second electrode respectively have first and second sides facing each other, the first and second sides being parallel to each other. In one embodiment, the first electrode includes a first contact electrode, an inner electrode, and a first connecting electrode connecting the first contact electrode and the first inner electrode to each other, and the second electrode includes a second contact electrode, an outer electrode partially surrounding the inner electrode of the first electrode, and a second connecting electrode connecting the second contact electrode and the outer electrode to each other. In one embodiment, the first electrode includes a first contact electrode, a first coupling electrode, and a first connecting electrode connecting the first contact electrode and the first coupling electrode to each other, the second electrode includes a second contact electrode, a second coupling electrode, and a second connecting electrode connecting the second contact electrode and the second coupling electrode to each other, and the first coupling electrode and the second coupling electrode comprise comb-shaped arrays. In one embodiment, a thickness of the insulating layer is 1 nm to 4 nm. In one embodiment, the semiconductor layer is an N-type semiconductor, and the first electrode and the second electrode are made of a material having a flatband voltage $V_{FB}$ greater than 0. In one embodiment, the N-type semiconductor material has a doping concentration of $5 \cdot 10^{14}/cm^{-3}$ to $5 \cdot 10^{17}/cm^{-3}$. In one embodiment, the semiconductor layer is a P-type semiconductor, and the first electrode and the second electrode are made of a material having a flatband voltage $V_{FB}$ less than 0. In one embodiment, the P-type semiconductor material has a doping concentration of $5 \cdot 10^{14}/cm^{-3}$ to $5 \cdot 10^{17}/cm^{-3}$. In one embodiment, the MISIM device further includes a substrate, and the back electrode is disposed between the semiconductor layer and the substrate. In one embodiment, a memory device includes a plurality of cells coupled to a plurality of wordlines and a plurality of bitlines. Each cell includes the MISIM device, a resistor, and a pass-gate transistor, a gate electrode of the pass-gate transistor connected to one of the plurality of wordlines and a source of the pass-gate transistor connected to one of the plurality of bitlines. In each cell, the second electrode of the MISIM device is connected to the ground, a bias voltage source provides a bias between the first electrode and the back electrode of the MISIM device, the first electrode of the MISIM device and one end of the resistor are connected to a drain of the pass-gate transistor, and a constant current source connects another end of the resistor to the ground. In one embodiment, a memory device includes a plurality of cells coupled to a plurality of wordlines and a plurality of bitlines. Each cell includes the MISIM device, a resistor, and a pass-gate transistor, a gate electrode of the pass-gate transistor connected to one of the plurality of wordlines and a source of the pass-gate transistor connected to one of the plurality of bitlines. In each cell, the back electrode of the MISIM device is connected to the ground, a bias voltage source provides a bias between the first electrode and the second electrode of the MISIM device, the first electrode of the MISIM device and one end of the resistor are connected to a drain of the pass-gate transistor, and a constant current source is connected another end of the resistor to the ground. In one embodiment, a memory device includes first and second cells cross-coupled to each other. The first and second cells each include the MISIM device, the back electrodes of the MISIM devices of the first and second cells are connected to the ground, the second electrode of the MISIM of the first cell and the first electrode of the MISIM of the second cell are coupled to each other, and are connected to a first bitline through a first pass-gate transistor, the first electrode of the MISIM of the first cell and the second electrode of the MISIM of the second cell are coupled to each other, and are connected to a second bitline through a second pass-gate transistor, and gate electrodes of the first and second pass-gate transistors are respectively connected to first and second wordlines.

In one embodiment, a method for operating a metal-insulator-semiconductor-insulator-metal (MISIM) device, in which the MISIM device includes a semiconductor layer, an insulating layer disposed over an upper surface of the semiconductor layer, a back electrode disposed over a lower surface of the semiconductor layer opposing the upper surface, and first and second electrodes disposed over the insulating layer and spaced-apart from each other, includes: increasing a voltage difference between the first electrode and the second electrode from a first value to a second value or decreasing the voltage difference between the first electrode and the second electrode from the second value to the first value, while maintaining connection of the second electrode and the ground and maintaining a bias between the first electrode and the back electrode. In one embodiment, the bias is a constant. In one embodiment, current passing through the first electrode of the MISIM has a peak when increasing the voltage difference between the first electrode and the second electrode from the first value to the second value or decreasing the voltage difference between the first electrode and the second electrode from the second value to the first value.

In one embodiment, a method for operating a metal-insulator-semiconductor-insulator-metal (MISIM) device, in which the MISIM device includes a semiconductor layer, an insulating layer disposed over an upper surface of the semiconductor layer, a back electrode disposed over a lower surface of the semiconductor layer opposing the upper surface, and first and second electrodes disposed over the insulating layer and spaced-apart from each other, includes: increasing a voltage difference between the first electrode and the back electrode from a first value to a second value or gradually decreasing the voltage difference between the first electrode and the back electrode from the second value to the first value, while maintaining connection of the back electrode and the ground and maintaining a bias between the first electrode and the second electrode. In one embodiment, the bias is a constant. In one embodiment, current passing through the first electrode of the MISIM has two peaks when increasing the voltage difference between the first electrode and the back electrode from the first value to the second value or decreasing the voltage difference between the first electrode and the back electrode from the second value to the first value.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claim is:

1. A semiconductor device, comprising:
a semiconductor layer;
an insulating oxide layer or an insulating nitride layer disposed over an upper surface of the semiconductor layer;
a layer comprising one or more of aluminum, gold, titanium, polysilicon, silver, nickel, and copper disposed over a lower surface of the semiconductor layer opposing the upper surface; and
first and second electrodes disposed over the insulating oxide or insulating nitride layer,
wherein the second electrode partially surrounds the first electrode and a portion of the first electrode extends beyond the second electrode.

2. The semiconductor device of claim 1, wherein a thickness of the insulating oxide layer or insulating nitride layer is 1 nm to 4 nm.

3. The semiconductor device of claim 1, wherein the semiconductor layer is an N-type semiconductor, and the first electrode and the second electrode are made of a material having a flatband voltage $V_{FB}$ greater than 0.

4. The semiconductor device of claim 3, wherein the N-type semiconductor material has a doping concentration of $5 \cdot 10^{14}/cm^{-3}$ to $5 \cdot 10^{17}/cm^{-3}$.

5. The semiconductor device of claim 1, wherein the semiconductor layer is a P-type semiconductor, and the first electrode and the second electrode are made of a material having a flatband voltage $V_{FB}$ less than 0.

6. The semiconductor device of claim 5, wherein the P-type semiconductor material has a doping concentration of $5 \cdot 10^{14}/cm^{-3}$ to $5 \cdot 10^{17}/cm^{-3}$.

7. The semiconductor device of claim 1, further comprising a substrate,
wherein the layer comprising one or more of aluminum, gold, titanium, polysilicon, silver, nickel, and copper is disposed between the semiconductor layer and the substrate.

8. A semiconductor device, comprising:
a semiconductor layer;
an oxide layer or a nitride layer disposed over an upper surface of the semiconductor layer;
a layer comprising one or more of aluminum, gold, titanium, polysilicon, silver, nickel, and copper disposed over a lower surface of the semiconductor layer opposing the upper surface; and
first and second electrodes disposed over the oxide or nitride layer,
wherein the first electrode includes a plurality of first elongated portions extending in a first direction,
the second electrode includes a plurality of a second elongated portions extending in a second direction,
wherein the first and second directions are opposing directions, and
wherein the first and second elongated portions are arranged in an alternating manner along a third direction that is perpendicular to the first and second directions.

9. The semiconductor device of claim 8, wherein a thickness of the oxide layer or nitride layer is 1 nm to 4 nm.

10. The semiconductor device of claim 8, wherein the semiconductor layer is an N-type semiconductor, and the first electrode and the second electrode are made of a material having a flatband voltage $V_{FB}$ greater than 0.

11. The semiconductor device of claim 10, wherein the N-type semiconductor material has a doping concentration of $5 \cdot 10^{14}/cm^{-3}$ to $5 \cdot 10^{17}/cm^{-3}$.

12. The semiconductor device of claim 8, wherein the semiconductor layer is a P-type semiconductor, and the first electrode and the second electrode are made of a material having a flatband voltage $V_{FB}$ less than 0.

13. The semiconductor device of claim 12, wherein the P-type semiconductor material has a doping concentration of $5 \cdot 10^{14}/cm^{-3}$ to $5 \cdot 10^{17}/cm^{-3}$.

14. The semiconductor device of claim 8, further comprising a substrate,
wherein the layer comprising one or more of aluminum, gold, titanium, polysilicon, silver, nickel, and copper is disposed between the semiconductor layer and the substrate.

15. A semiconductor device, comprising:
a semiconductor layer;
an insulating oxide or an insulating nitride layer disposed over an upper surface of the semiconductor layer;
a layer comprising one or more of aluminum, gold, titanium, polysilicon, silver, nickel, and copper disposed over a lower surface of the semiconductor layer opposing the upper surface; and
first and second electrodes disposed over the insulating oxide or insulating nitride layer and spaced-apart from each other,
wherein the first electrode completely surrounds the second electrode as seen in plan view.

16. The semiconductor device of claim 15, wherein a thickness of the insulating oxide or insulating nitride layer is 1 nm to 4 nm.

17. The semiconductor device of claim 15, wherein the semiconductor layer is an N-type semiconductor is material having a doping concentration of $5 \cdot 10^{14}/cm^{-3}$ to $5.10^{17}/cm^{-3}$.

18. The semiconductor device of claim 15, wherein the semiconductor layer is a P-type semiconductor is material having a doping concentration of $5 \cdot 10^{14}/cm^{-3}$ to $5 \cdot 10^{17}/cm^{-3}$.

19. The semiconductor device of claim 15, further comprising a substrate,
wherein the layer comprising one or more of aluminum, gold, titanium, polysilicon, silver, nickel, and copper is disposed between the semiconductor layer and the substrate.

20. The semiconductor device of claim 15, wherein the first electrode and the second electrode are made of one selected from group consisting of gold, silver, platinum, nickel, aluminum, hafnium, magnesium, and an alloy thereof.

\* \* \* \* \*